(12) United States Patent
Nozawa

(10) Patent No.: US 7,894,116 B2
(45) Date of Patent: Feb. 22, 2011

(54) ELECTRO-OPTICAL DEVICE AND ELECTRONIC APPARATUS

(75) Inventor: Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 156 days.

(21) Appl. No.: 12/350,342

(22) Filed: Jan. 8, 2009

(65) Prior Publication Data

US 2009/0174923 A1 Jul. 9, 2009

(30) Foreign Application Priority Data

Jan. 9, 2008 (JP) ............................. 2008-001896
Jan. 9, 2008 (JP) ............................. 2008-001899

(51) Int. Cl.
*G02F 1/07* (2006.01)
(52) U.S. Cl. ...................... 359/245; 359/463
(58) Field of Classification Search ................. 359/238, 359/242, 463, 464, 465, 466
See application file for complete search history.

(56) References Cited

U.S. PATENT DOCUMENTS 7,759,857 B2 * 7/2010 Vaufrey et al. .............. 313/504

| | | | |
|---|---|---|---|
| 2002/0001128 A1 * | 1/2002 | Moseley et al. | 359/465 |
| 2007/0058127 A1 * | 3/2007 | Mather et al. | 349/159 |
| 2007/0228944 A1 * | 10/2007 | Oosono et al. | 313/504 |
| 2008/0204871 A1 * | 8/2008 | Mather et al. | 359/462 |

FOREIGN PATENT DOCUMENTS

JP 2001-318341 11/2001

* cited by examiner

*Primary Examiner*—Timothy J Thompson
(74) *Attorney, Agent, or Firm*—Workman Nydegger

(57) ABSTRACT

An electro-optical device comprising a first substrate, a second substrate facing the first substrate, a light-emitting layer arranged between the first substrate and the second substrate which is capable of emitting light from a plurality of pixels including at least a first subpixel and a second subpixel, the first subpixel forming a first image and the second subpixel forming a second image, and a light-shielding layer arranged between the second substrate and the light-emitting layer having an opening which is capable of transmitting light emitted from a first subpixel in the light-emitting layer through the second substrate to a first range and transmitting light emitted from the second subpixel of the light-emitting layer through the second substrate to a second range.

18 Claims, 28 Drawing Sheets

ELECTRO-OPTICAL DEVICE AND ELECTRONIC APPARATUS

The entire disclosures of Japanese Patent Application Nos. 2008-001896, filed Jan. 9, 2008 and 2008-001899, filed Jan. 9, 2008 are expressly incorporated herein by reference.

BACKGROUND OF THE INVENTION

1. Technical Field

The present invention relates to electro-optical devices and electronic apparatuses. More specifically, the present invention relates to electro-optical devices and electronic apparatuses capable of displaying a plurality of displays in different directions.

2. Related Art

One example of an electro-optical device currently known in the art is an organic electroluminescent device, known as an organic EL device. For example, one such device described in Japanese Patent Application No. JP-A-2001-318341 discloses an organic EL display capable of displaying a stereoscopic image by alternately blocking light emitted from an organic EL element using a pair of adjacent liquid crystal elements.

The display includes an organic EL element and a pair of liquid crystal elements, along with a mechanism for displaying two different images in two directions, and will be described with reference to the cross-sectional views shown in FIGS. 27A and 27B. As shown in FIG. 27A, the display 600 includes an organic EL element 601 and a pair of liquid crystal elements 603. The pair of liquid crystal elements 603 face the organic EL element and includes a first liquid crystal sub-element 603a and a second liquid crystal sub-element 603b.

Because the second liquid crystal sub-element 603b blocks a portion of the light emanating from the organic EL element 601, the light is displayed at a first range 605. In this case, when the organic EL element 601 forms a first image, the first image can be viewed from the first range 605.

As shown in FIG. 27B, because the first liquid crystal sub-element 603a blocks a portion of the light emanating from the organic EL element 601, the light is displayed a second range 607. In this case, when the organic EL element 601 forms a second image, the second image can be viewed from the second range 607.

The first and second images can be viewed as a continuous image by alternately switching which of the first and second liquid crystal subelements 603a and 603b are blocking the display, so that a first and second image may be displayed by the organic EL element 601.

As shown in FIG. 28A, there is a subrange 611 in which the first range 605 and the second range 607 overlap. As such, a superimposed image of the first and second images may be seen in the subrange 611.

Only the first image can be seen in a subrange 613a portion of the first range 605, which excludes the subrange 611. Similarly, only the second image can be seen in the subrange 613b of the second range 607, which excludes the subrange 611 from the second range 607. The subrange 613a and the subrange 613b are referred to as a suitable viewing range 613a and a suitable viewing range 613b, respectively.

As shown in FIG. 28B, the suitable viewing ranges 613a and 613b can be extended by reducing the distance L between the organic EL element 601 and the pair of liquid crystal elements 603.

In the display described in JP-A-2001-318341, a glass substrate is arranged between the organic EL element and the liquid crystal elements. In order to reduce the distance L in the display, the thickness of the glass substrate must be reduced. The reduction in the thickness of the glass substrate, however, leads to many disadvantages, such as a reduction in yield, an increase in production time, and a reduction in quality, due to a reduction in the strength of the substrate.

That is, the display in the related art has the unsolved problem of difficulty in extending the suitable viewing range.

BRIEF SUMMARY OF THE INVENTION

An advantage of some aspects of the invention is that it provides the following aspects and embodiments.

A first aspect of the invention is an electro-optical device comprising a first substrate, a second substrate facing the first substrate, a light-emitting layer arranged between the first substrate and the second substrate which is capable of emitting light from a plurality of pixels including at least a first subpixel and a second subpixel, the first subpixel forming a first image and the second subpixel forming a second image, and a light-shielding layer arranged between the second substrate and the light-emitting layer having an opening which is capable of transmitting light emitted from a first subpixel in the light-emitting layer through the second substrate to a first range and transmitting light emitted from the second subpixel of the light-emitting layer through the second substrate to a second range.

Thus, the first image formed by the first subpixel can be seen in the first range. The second image formed by the second subpixel can be seen in the second range. In the electro-optical device, therefore, the directional display can be performed in at least two directions.

The light-shielding layer is arranged between the second substrate and the light-emitting layer. That is, the light-shielding layer is arranged between the first substrate and the second substrate. Thus, the distance between the plurality of pixels and the light-shielding layer can be reduced as compared to the case where the light-shielding layer is arranged outside the first substrate and the second substrate. In the electro-optical device, therefore, suitable viewing ranges in the directions in which the directional display is performed can be easily extended.

BRIEF DESCRIPTION OF THE DRAWINGS

The invention will be described with reference to the accompanying drawings, wherein like numbers reference like elements.

DESCRIPTION OF EXEMPLARY EMBODIMENTS

A display including an organic EL device, which is an example of an electro-optical device capable of performing aspects of the invention, will be described with reference to the attached drawings.

Figure 1:
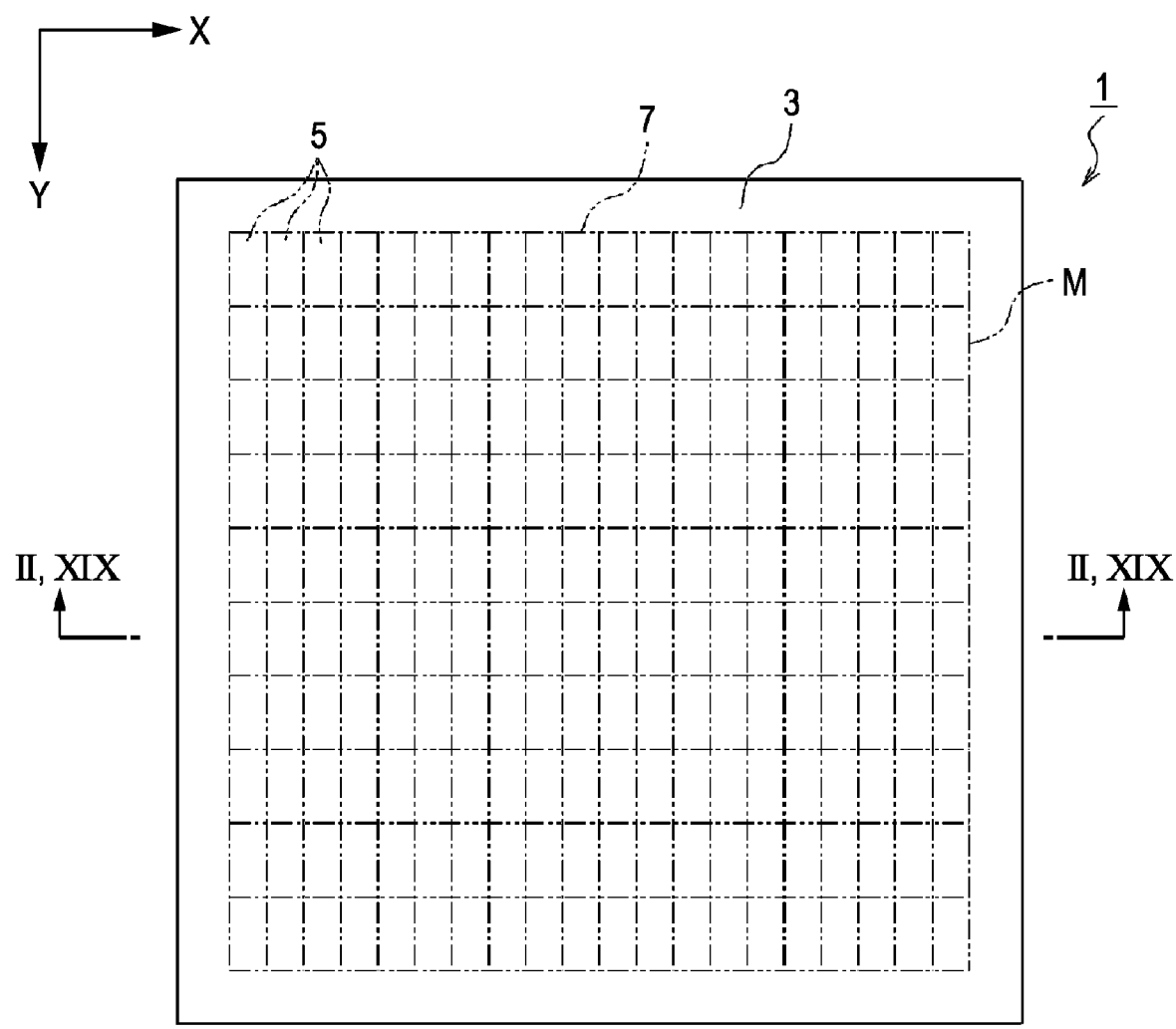
FIG. 1 is a plan view of a display according to an embodiment of the invention.

In one embodiment of the invention, the display 1 includes a display surface 3 as shown in FIG. 1.

The display 1 includes a plurality of pixels 5. The plurality of pixels 5 are arranged in a display region 7 in the X and Y directions in order to form a matrix M in which the X direction defines the row direction and the Y direction defines the column direction. In the display 1, the plurality of pixels 5 form the matrix M in which the number of rows is m, where m represents an integer of 1 or more, and the number of columns is 2×n, where n represents an integer of 1 or more. The display 1 can display an image on the display surface 3 by selectively emitting light from the plurality of pixels 5 through the display surface to the outside of the display 1. The display region 7 indicates a region where an image can be displayed. In FIG. 1, the pixels 5 are exaggerated in order to facilitate understanding of the structure.

Figure 2:
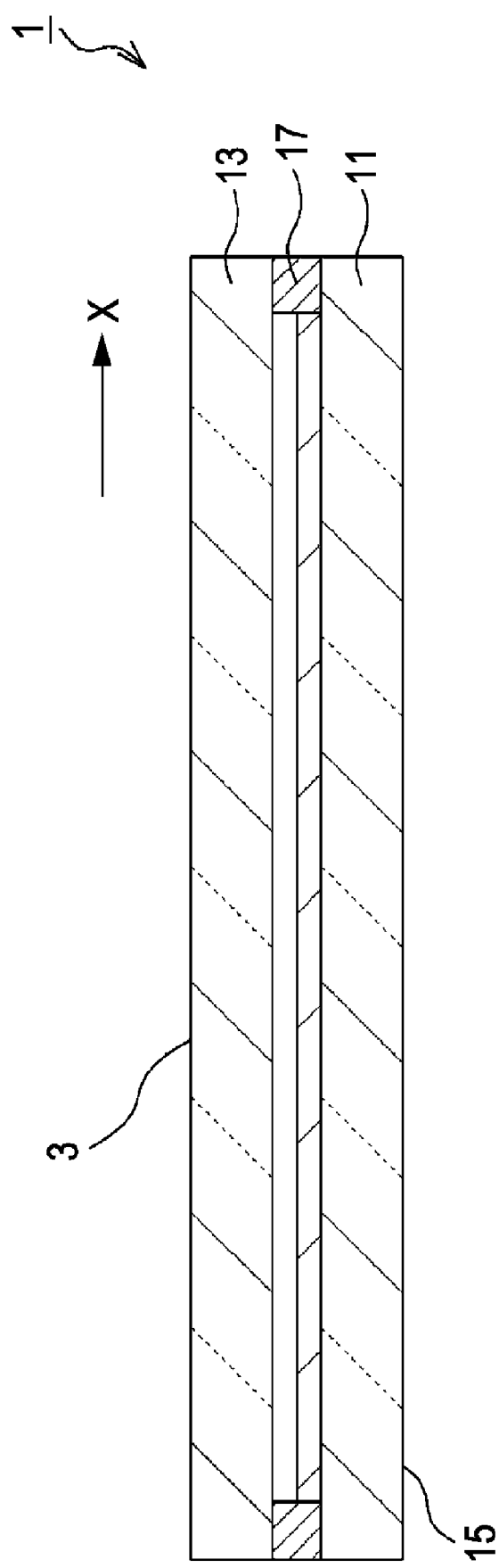
FIG. 2 is a cross-sectional view taken along line II-II in FIG. 1.

As shown in FIG. 2 which is a cross-sectional view taken along line II-II in FIG. 1, the display 1 includes an element substrate 11 and a sealing substrate 13.

The element substrate 11 includes switching elements, described below, which correspond to the plurality of pixels 5 on the display surface 3, i.e., on the side of display where the sealing substrate 13 is disposed.

The sealing substrate 13 faces the element substrate and is located at a position which is closer to the display surface 3 than the element substrate 11. The sealing substrate 13 includes a light-shielding film, described more fully below, located adjacent to a bottom surface 15, which comprises the back surface of the display surface 3 of the display 1, which is adjacent to the element substrate 11.

A portion between the element substrate 11 and the sealing substrate 13 is sealed with a seal 17 surrounding the display region 7 at a position inside the perimeter of the display 1.

Figure 3:
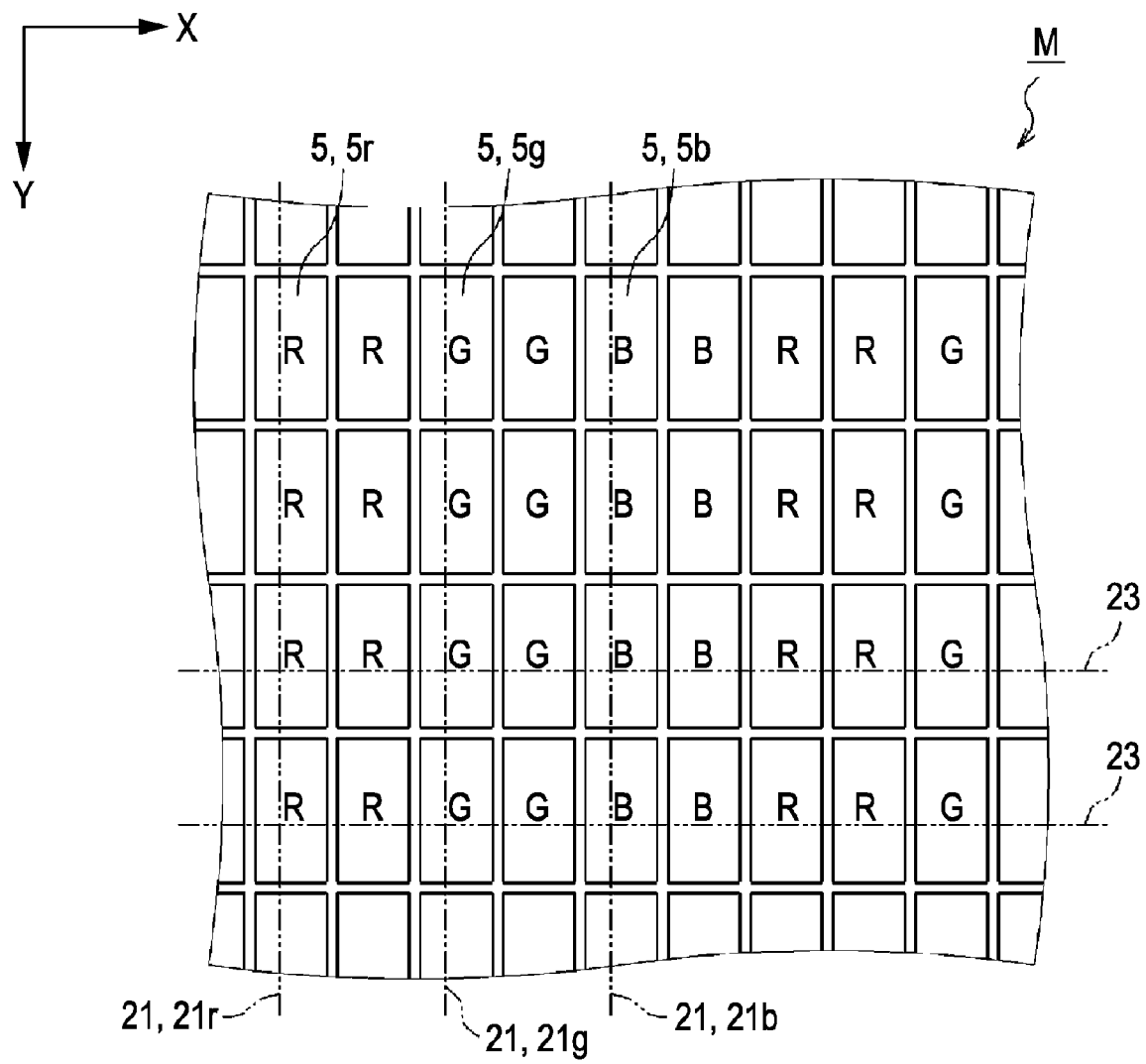
FIG. 3 is a fragmentary plan view of a plurality of pixels.

As shown in FIG. 3, each of the pixels 5 in the display 1 is configured to emit light through the display surface 3 in such a manner that the color of the light is selected from red (R), green (G), and blue (B). That is, the plurality of pixels 5 constituting the matrix M are divided into pixels 5r that emit red light, pixels 5g that emit green light, and pixels 5b that emit blue light.

Red (R) is not limited to a pure red hue but includes orange and the like. Green (G) is not limited to a pure green hue but includes bluish green, yellowish green, and the like. Blue (B) is not limited to a pure blue hue but includes bluish purple, bluish green, and the like. More specifically, red (R) light is defined as light having a peak wavelength of 570 nm or more and within the visible region. Green (G) light is defined as light having a peak wavelength of 500 nm to 565 nm, and blue (B) light is defined as light having a peak wavelength of 415 nm to 495 nm.

In the matrix M, the plurality of pixels 5 aligned at the same position in the Y direction constitute one pixel column 21. The plurality of pixels 5 aligned at the same position in the X direction constitute one pixel row 23. Each of the pixels 5 in one pixel column 21 are configured to emit R, G, or B light. That is, the matrix M includes pixel columns 21r each consisting of a plurality of red pixels 5r aligned at the same position in the Y direction, pixel columns 21g each constituted by the plurality of green pixels 5g aligned in the same position in the Y direction, and pixel columns 21b each constituted by the plurality of blue pixels 5b aligned in same position in the Y direction. In the display 1, two pixel columns 21r of red pixels, two pixel columns 21g of green pixels, and two pixel columns 21b of blue pixels are arranged in a repeating pattern in the X direction.

Figure 4:
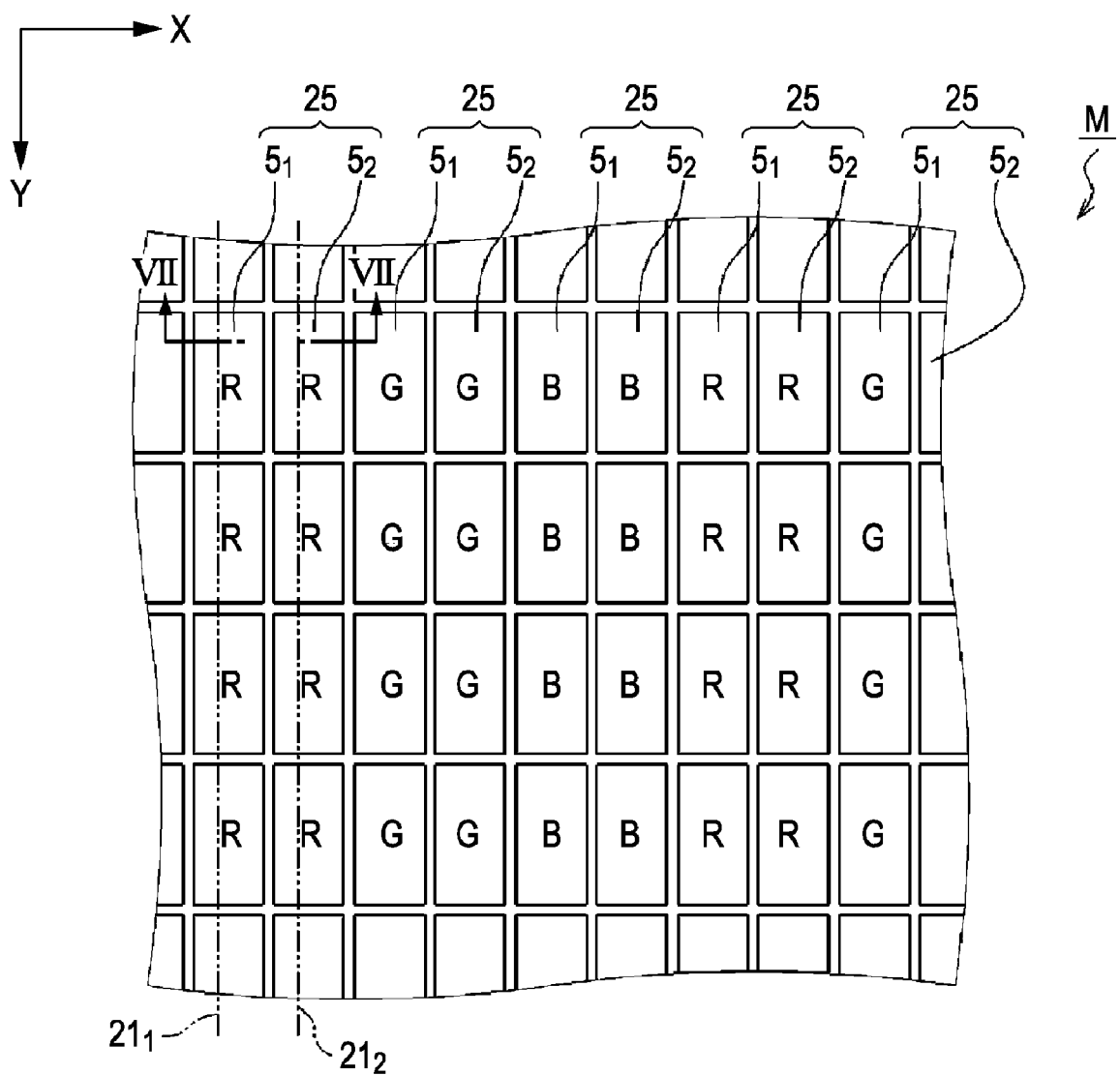
FIG. 4 is a fragmentary plan view of a plurality of pixels.

The plurality of pixels 5 of the matrix M are divided into a plurality of first pixels $5_1$ and a plurality of second pixels $5_2$ in the display 1, as shown in FIG. 4. The display 1 can display a first image on the display surface 3 by selectively emitting light from the plurality of first pixels $5_1$ to the outside of the display 1 through the display surface 3. Furthermore, the display 1 can display a second image on the display surface 3 by selectively emitting light from the plurality of second pixels $5_2$ to the outside of the display 1 through the display surface 3.

The first image and the second image may be the same image or may be different. Hereinafter, the expressions "pixels 5", "pixels 5r, 5g, and 5b", and "first pixels $5_1$ and second pixels $5_2$" may be used, depending on the context of the description. In the case where R, G, and B of the first and second pixels $5_1$ and $5_2$ are distinguished, the expressions "first pixels $5r_1$, $5g_1$, and $5b_1$" and "second pixels $5r_2$, $5g_2$, and $5b_2$" may also be used.

In the display 1, the first pixels $5_1$ and the second pixels $5_2$ are arranged in an alternating configuration in the X direction. One pixel column 21 is constituted by a plurality of first pixels $5_1$ or a plurality of second pixels $5_2$. That is, the matrix M includes pixel columns $21_1$ and $21_2$, where the pixel columns $21_1$ are formed of the plurality of first pixels $5_1$ aligned at the same position in the Y direction, and each of the pixel columns $21_2$ are formed of the plurality of second pixels $5_2$ aligned at the same position in the Y direction. Hereinafter, the expressions "pixel column 21", "pixel columns 21r, 21g, and 21b", and "pixel columns $21_1$ and $21_2$" may be used to describe the columns of pixels. In the case where R, G, and B of the pixel columns $21_1$ and $21_2$ are distinguished, the expressions "pixel columns $21r_1$, $21g_1$, and pixel columns $21b_1$" and "pixel columns $21r_2$, $21g_2$, and $21b_2$" may also be used.

The plurality of pixels 5 constituting the matrix M are divided into a plurality of pixel groups 25 in the display 1, with each pixel group 25 being constituted by adjacent pixels 5, such as first pixel $5_1$ and the adjacent second pixel $5_2$ in the X direction. The order of the sequence of the first and second pixels $5_1$ and $5_2$ in each of the pixel groups 25 is the same in all the pixel groups 25. As shown in FIG. 4, in the display 1, the first pixels $5_1$ and the second pixels $5_2$ are arranged in this order from left to right in the X direction. Either the first pixel $5_1$ or the second pixel $5_2$ may be located on the left side or the right side as long as the order of the sequence of the first and second pixels $5_1$ and $5_2$ is the same among the plurality of pixel groups 25.

In the display 1, the first pixels $5_1$ and the second pixels $5_2$ constituting the pixel groups 25 are each configured to emit R, G, or B light. That is, the first pixels $5r_1$ and the second pixels $5r_2$ constitute one pixel group 25. The first pixels $5g_1$ and the second pixels $5g_2$ constitute one pixel group 25. The first pixels $5b_1$ and the second pixels $5b_2$ constitute one pixel group 25. Hereinafter, in the case where R, G, and B pixel groups 25 are distinguished from the pixel groups 25 as a whole, the expressions "pixel groups $25r$", "pixel groups $25g$", and "pixel groups $25b$" will be used.

Figure 5:
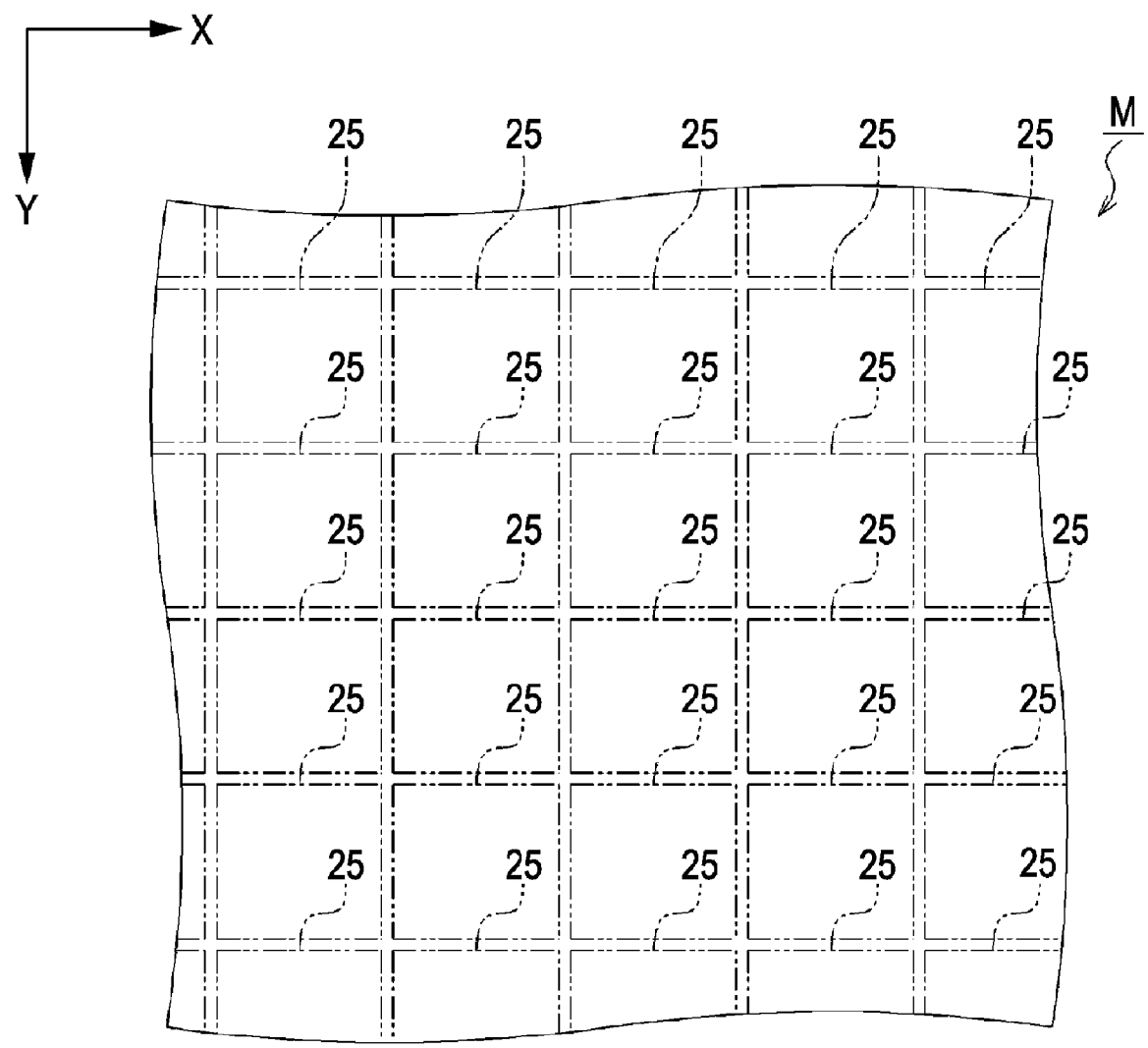
FIG. 5 is a plan view illustrating the arrangement of a plurality of pixel groups.

In the matrix M, as shown in FIG. 5, the plurality of pixel groups 25 are arranged in the X and Y directions. That is, the plurality of pixel groups 25 are arranged in a matrix.

In the display 1, as described above, the plurality of pixels 5 form the matrix M in which the number of rows is m and the number of columns is 2×n. Thus, the plurality of pixel groups 25 form an m×n matrix.

Figure 6:
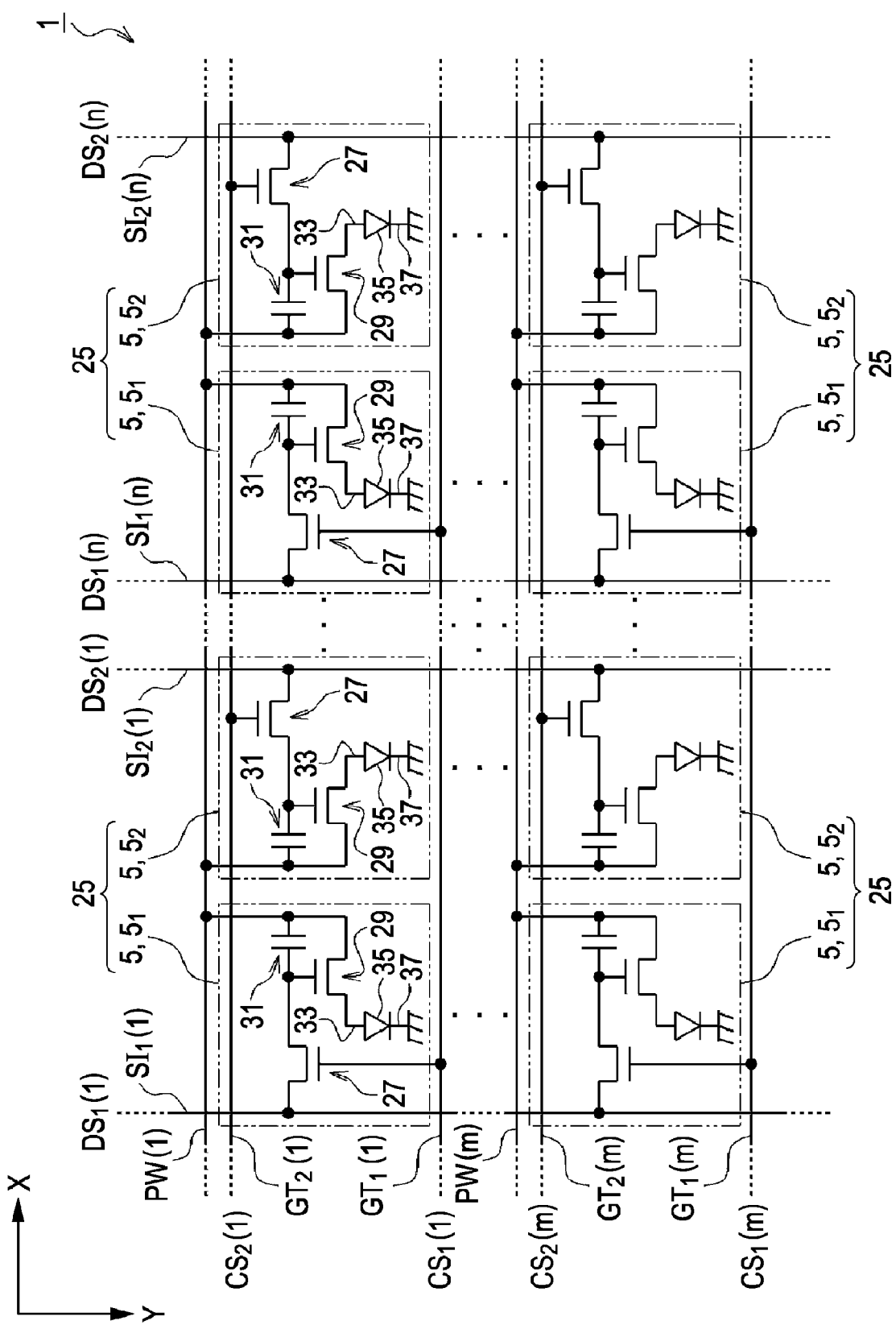
FIG. 6 is a schematic circuit diagram of a display.

In the display 1, as shown in FIG. 6 which illustrates a circuit configuration, each of the pixels 5 includes a select transistor 27, a drive transistor 29, a capacitor element 31, a pixel electrode 33, an organic layer 35, and a common electrode 37. The select transistor 27 and the drive transistor 29 are formed of a thin-film transistor (TFT) element and also serve as switching elements. In the display 1, the select transistor 27 is formed of an N-channel TFT element. The drive transistor 29 is formed of a P-channel TFT element.

The display 1 includes m scan lines $GT_1$, m scan lines $GT_2$, n data lines $SI_1$, n data lines $SI_2$, and m power lines PW.

Hereinafter, a particular scan line $GT_1$ is identified, the expression "scan lines $GT_1(h)$" may be used, wherein h represents an integer of 1 to m. Similarly, when a particular scan line $GT_2$ is identified, the expression "scan lines $GT_2(h)$" may be used. Further, when a particular power line is identified, the expression "power lines PW(h)" may be used.

When a particular data lines $SI_1$ is identified, the expression "data lines $SI_1(j)$" may be used, wherein j represents an integer of 1 to n. When a particular data line $SI_2$ is identified, the expression "data lines $SI_2(j)$" may be used, wherein j represents an integer of 1 to n.

The m scan lines $GT_1$ and the m scan lines $GT_2$ extend in the X direction and are separated apart from one another a predetermined distance in the Y direction. The n data lines $SI_1$ and the n data lines $SI_2$ extend in the Y direction and are formed apart from one another a predetermined distance in the X direction. The m scan lines $GT_1$ and the n data lines $SI_1$ are arranged in a lattice. The first pixels $5_1$ are arranged at positions corresponding to intersections between the scan lines $GT_1$ and the data lines $SI_1$.

Similarly, the m scan lines $GT_2$ and the n data lines $SI_2$ are arranged in a lattice. The second pixels $5_2$ are arranged at the intersections of the scan lines $GT_2$ and the data lines $SI_2$.

The scan lines $GT_1$ and the scan lines $GT_2$ comprise the pixel rows 23 (see FIG. 3). As shown in FIG. 6, each of the scan lines $GT_1$ corresponds to a first pixel $5_1$ in a corresponding pixel row 23. Each of the scan lines $GT_2$ corresponds to a second pixel $5_2$ in a corresponding pixel row 23.

The data lines $SI_1$ and the data lines $SI_2$ comprise the pixel columns 21 (see FIG. 3). As shown in FIG. 6, each of the data lines $SI_1$ corresponds to a first pixel $5_1$ in a corresponding pixel column 21. That is, each of the data lines $SI_1$ corresponds to a pixel column $21_1$ (see FIG. 4). Each of the data lines $SI_2$ corresponds to a second pixel $5_2$ in a corresponding pixel column 21. That is, each of the data lines $SI_2$ corresponds to a pixel column $21_2$ (see FIG. 4).

As shown in FIG. 6, the m power lines PW extend in the X direction and are separated by a predetermined distance in the Y direction. Each of the power lines PW corresponds to a pixel row 23 (see FIG. 3).

The gate electrode of each of the select transistors 27 shown in FIG. 6 is electrically connected to a corresponding scan line $GT_1$ or $GT_2$. The source electrode of each of the select transistors 27 is electrically connected to a corresponding data line $SI_1$ or $SI_2$. The drain electrode of each of the select transistors 27 is electrically connected to the gate electrode of a corresponding drive transistor 29 and one electrode of a corresponding capacitor element 31.

The other electrode of the corresponding capacitor element 31 and the source electrode of the corresponding drive transistor 29 are electrically connected to a corresponding power line PW.

The drain electrode of each of the drive transistors 29 is electrically connected to a corresponding pixel electrode 33. Each pixel electrode 33 and common electrode 37 form a pair of electrodes, the pixel electrode 33 serving as a positive electrode, and the common electrode 37 serving as a negative electrode.

The common electrode 37 is arranged across the plurality of pixels 5 constituting the matrix M and operates across the plurality of pixels 5.

Each of the organic layers 35 arranged between the corresponding pixel electrode 33 and the common electrode 37 are composed of an organic material and include a light-emitting sublayer.

Scan signals are supplied to the scan lines $GT_1$ and $GT_2$ connected to the select transistors 27, so as to turn on the select transistors 27. At this point, data signals are supplied through the data lines $SI_1$ and $SI_2$ connected to the select transistors 27 to turn on the drive transistors 29. Gate potentials of the drive transistors 29 are held only for a certain period of time by holding potentials of the data signals across the capacitor elements 31 for a predetermined period of time, so that the drive transistors 29 remain in the ON state for a predetermined period of time.

When the drive transistors 29 remain in the ON state, in response to the gate potentials of the drive transistors 29, currents flow from the power lines PW to the common electrode 37 through the pixel electrodes 33 and the organic layers 35. The light-emitting sublayers included in the organic layers 35 emit light beams having luminance levels in proportional to the currents flowing through the organic layers 35. The display 1 is one of top-emission organic EL devices in which light emanating from the light-emitting sublayers in the organic layers 35 emerges from the display surface 3 through the sealing substrate 13.

The structures of the element substrate 11 and the sealing substrate 13 will be described in more detail below.

Figure 7:
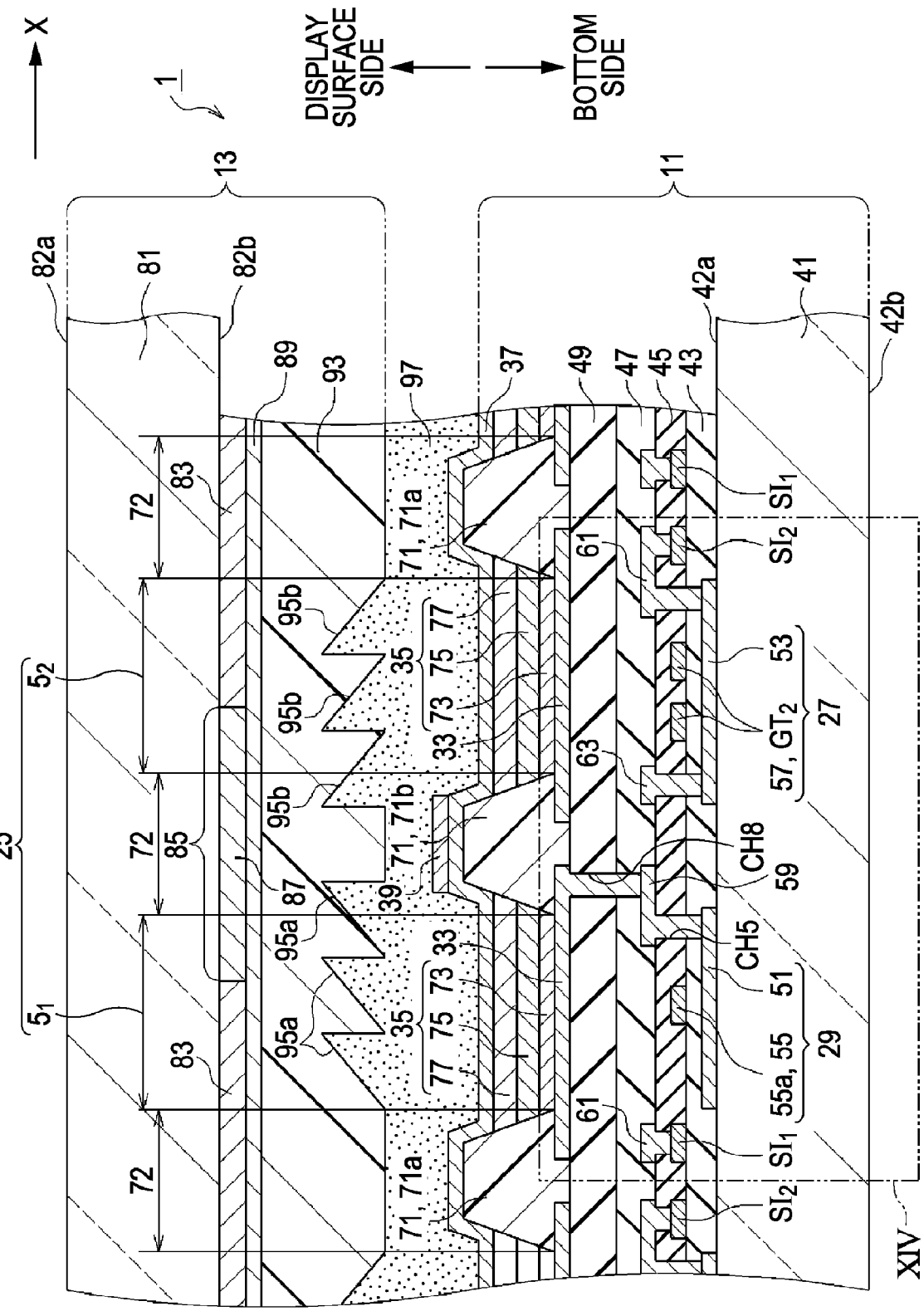
FIG. 7 is a cross-sectional view taken along line VII-VII in FIG. 4.

The element substrate 11 includes a first sub-substrate 41 as shown in FIG. 7, which is a cross-sectional view taken along line VII-VII in FIG. 4.

The first sub-substrate 41 is composed of a light-transmitting material such as glass or quartz. The first sub-substrate 41 has a first surface 42a facing toward the display surface 3 and a second surface 42b facing toward the bottom surface 15.

A gate insulating film 43 is arranged on the first surface 42a of the first sub-substrate 41. An insulating film 45 is arranged on the surface of the gate insulating film 43 adjacent to the display surface 3. An insulating film 47 is arranged on the surface of the insulating film 45 adjacent to the display surface 3. An insulating film 49 is arranged on the surface of the insulating film 47 adjacent to the display surface 3.

First semiconductor layers 51 corresponding to the drive transistors 29 of the pixels 5 and second semiconductor layers 53 corresponding to the select transistors 27 of the pixels 5 are provided on the first surface 42a of the first sub-substrate 41.

Figure 8:
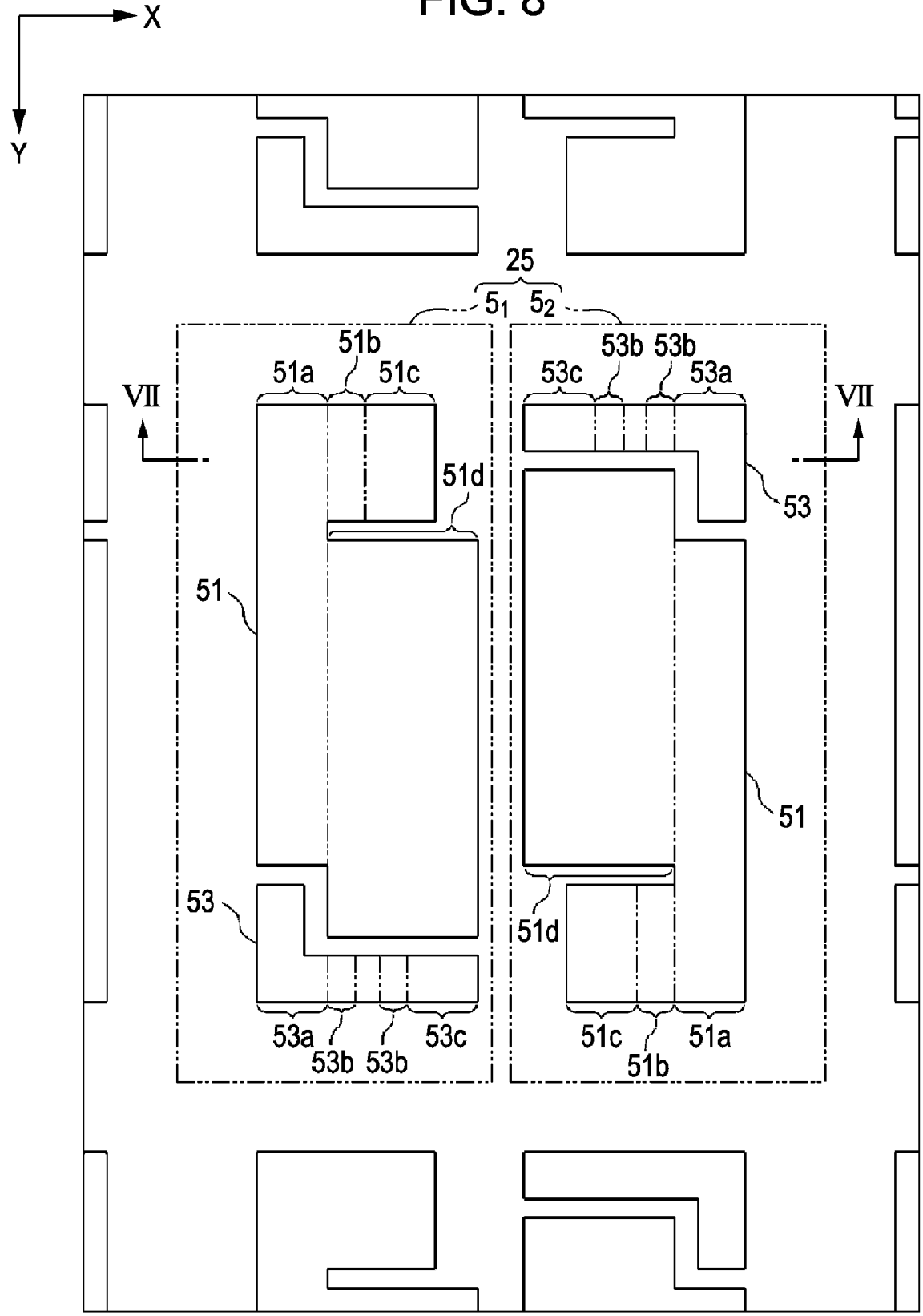
FIG. 8 is a plan view of first semiconductor layers and second semiconductor layers.

As shown in FIG. 8, the first semiconductor layers 51 and the second semiconductor layers 53 are each arranged so as to correspond to a pixel 5. FIG. 7 is a cross-sectional view taken along line VII-VII in FIG. 8.

The first semiconductor layers 51 and the second semiconductor layers 53 are arranged adjacent to each other in the Y direction at predetermined intervals in the Y direction.

Each of the first semiconductor layers 51 includes a source region 51a, a channel region 51b, a drain region 51c, and an electrode portion 51d. The source region 51a, the channel region 51b, and the drain region 51c are aligned in the X direction. The electrode portion 51d and the channel region 51b are aligned in the Y direction at predetermined intervals in the Y direction. The electrode portion 51d and the drain region 51c are aligned in the Y direction at predetermined intervals in the Y direction. The electrode portion 51d and the source region 51a are connected and arranged adjacent to each other in the X direction.

Each of the second semiconductor layers 53 includes a source region 53a, channel regions 53b, and a drain region 53c. The source region 53a, the channel region 53b, and the drain region 53c are aligned in the X direction.

The contours of the first semiconductor layers 51 of each pixel group 25 are rotationally symmetric between the first and second pixels 5₁ and 5₂ when viewed from above. Similarly, the contours of the second semiconductor layers 53 are rotationally symmetric between the first and second pixels 5₁ and 5₂ when viewed from above.

As shown in FIG. 7, surfaces of the first semiconductor layers 51 and the second semiconductor layers 53 adjacent to the display surface 3 are covered with the gate insulating film 43. The gate insulating film 43 may be composed of, for example, silicon oxide.

Figure 9:
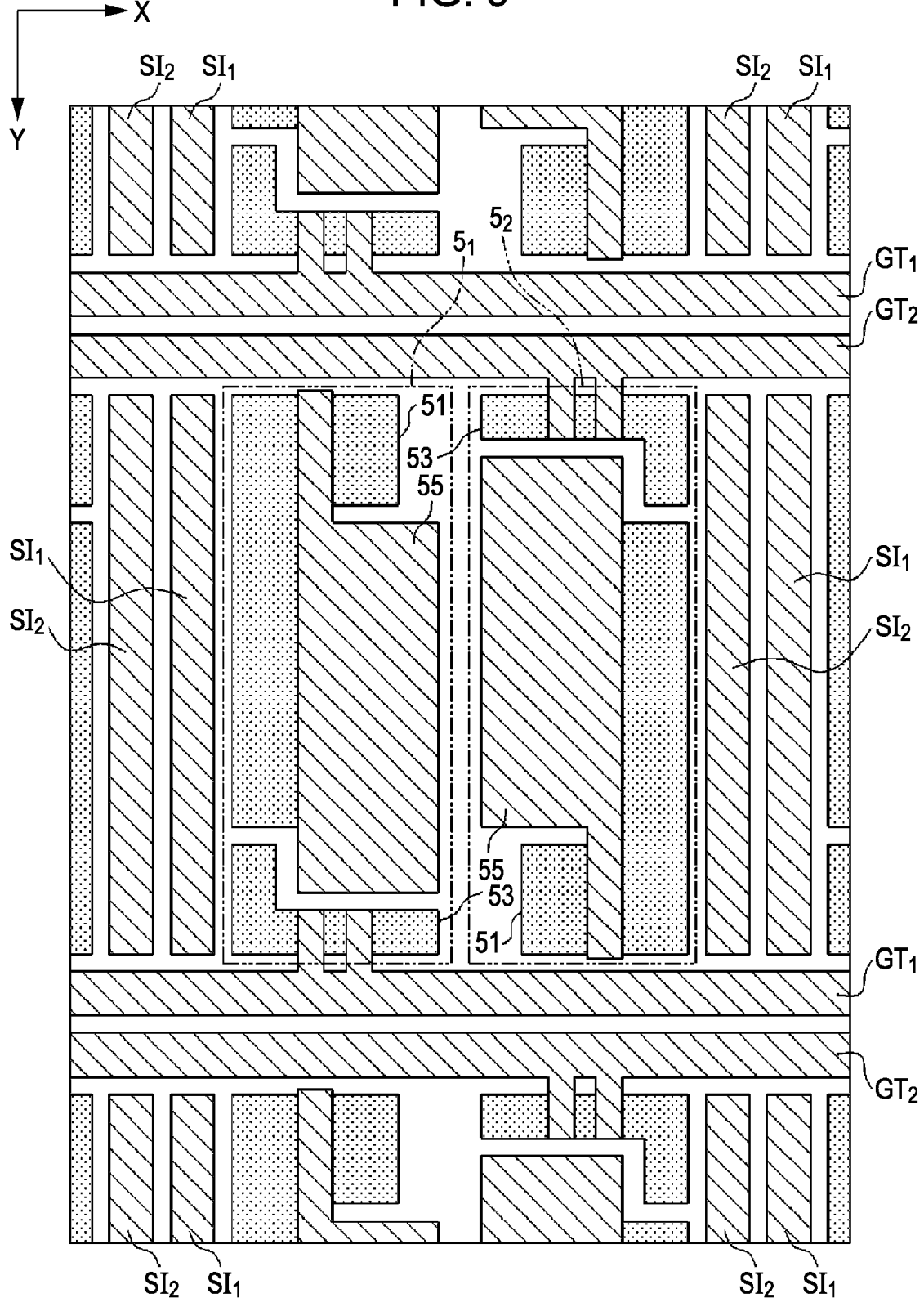
FIG. 9 is a plan view of first semiconductor layers, second semiconductor layers, island electrodes, scan lines, and data lines.

As shown in FIG. 9 which is a plan view, island electrodes 55 overlapping the first semiconductor layers 51, the scan lines GT₁ and GT₂, and the data lines SI₁ and SI₂ are provided on the surface of the gate insulating film 43 adjacent to the display surface 3.

Figure 10:
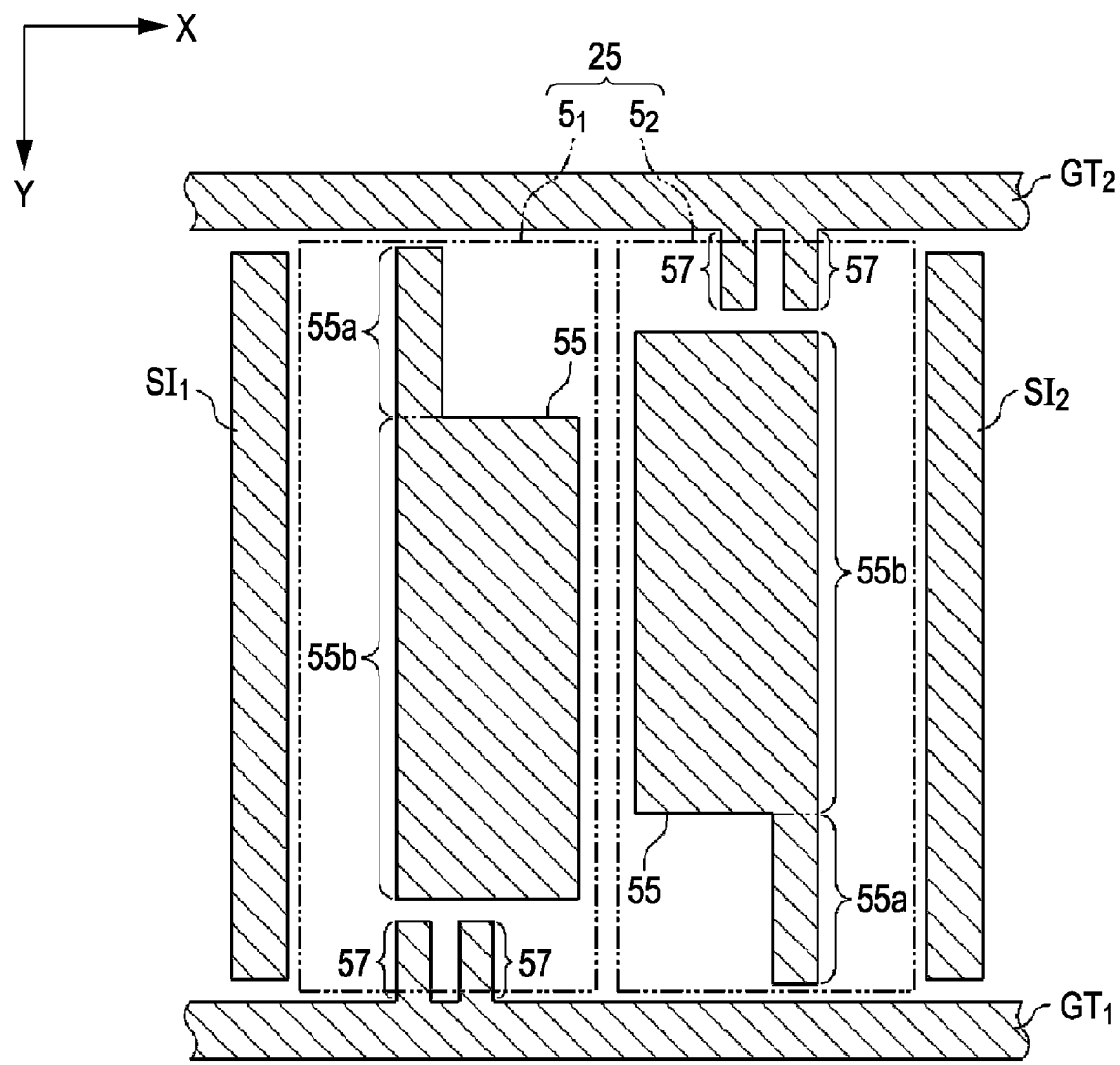
FIG. 10 is a plan view of island electrodes, scan lines, and data lines.

As shown in FIG. 10 which is a plan view, each of the island electrodes 55 includes a gate electrode portion 55a and an electrode portion 55b. The gate electrode portion 55a and the electrode portion 55b are connected and arranged in the Y direction.

Each of the gate electrode portions 55a is superposed on the channel region 51b of a corresponding first semiconductor layer 51, as shown in FIG. 8. Each of the electrode portions 55b are superposed on the electrode portion 51d of a corresponding first semiconductor layer 51 in plan. The electrode portion 51d and the electrode portion 55b partially constitute a corresponding capacitor element 31.

Each of the scan lines GT₁ and GT₂ have two gate electrode portions 57 for a corresponding pixel 5, the two gate electrode portions 57 extending toward the corresponding pixel 5 in the Y direction. The gate electrode portions 57 are superposed on the channel regions 53b of the second semiconductor layers 53 shown in FIG. 8.

Each of the island electrodes 55 in a corresponding pixel 5 are adjacent to a corresponding data line SI₁ or SI₂ which correspond to a pixel 5 in the X direction. In the display 1, two island electrodes 55 are located between the data line SI₁ corresponding to the first pixel 5₁ and the data line SI₂ corresponding to the second pixel 5₂ in each of the pixel groups 25 in the X direction.

Furthermore, the two island electrodes 55 in each of the pixel groups 25 are located in the Y direction between the scan line GT₁ corresponding to the first pixel 5₁ and the scan line GT₂ corresponding to the second pixel 5₂ in the pixel group 25.

Examples of materials constituting the island electrodes 55, the scan lines GT₁ and GT₂, and the data lines SI₁ and SI₂ include metals such as aluminum, copper, molybdenum, tungsten, and chromium, and alloys containing these metals. As shown in FIG. 7, surfaces of the gate electrode portions 55a, including the island electrodes 55, the gate electrode portions 57, including the scan lines GT₁ and GT₂, and the data lines SI₁ and SI₂ adjacent to the display surface 3 are covered with the insulating film 45.

Figure 11:
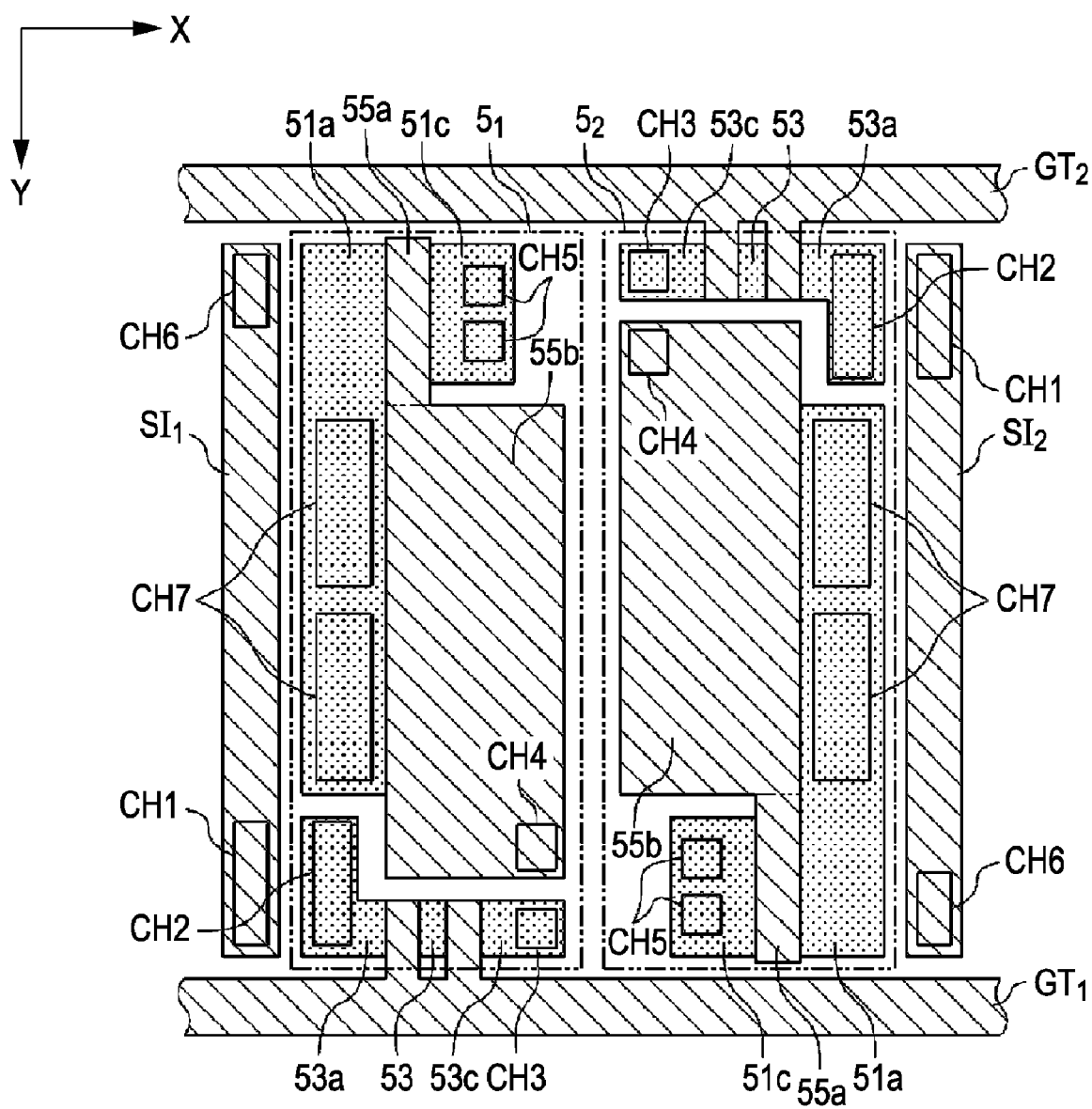
FIG. 11 is a plan view of contact holes.

As shown in FIG. 11 which is a plan view, the insulating film 45 has contact holes CH1, CH2, CH3, CH4, CH5, CH6, and CH7 corresponding to each of the pixels 5.

Each of the contact holes CH1 is arranged in a portion of the insulating film 45 which is superposed on a corresponding data lines SI₁ or SI₂ as viewed from above. Each contact hole CH1 faces the source region 53a of a corresponding second semiconductor layer 53 in the X direction. Each contact hole CH1 communicates with the corresponding data line SI₁ or SI₂.

Each of the contact holes CH2 are arranged in a portion of the insulating film 45 superposed over a corresponding source regions 53a. Each contact hole CH2 is adjacent to a corresponding contact holes CH1 in the X direction. Each contact hole CH2 communicates with the source region 53a of a second semiconductor layer 53.

Each of the contact holes CH3 are arranged in a portion of the insulating film 45 superposed over a corresponding drain region 53c. Each contact hole CH3 communicates with the drain region 53c of a corresponding second semiconductor layer 53.

Each contact hole CH4 is arranged in a portion of the insulating film 45 over on a corresponding electrode portion 55b. Each contact hole CH4 is adjacent to a corresponding contact hole CH3 in the Y direction. Each contact hole CH4 communicates with a corresponding electrode portion 55b.

Two contact holes CH5 are arranged in each portion of the insulating film 45 above the drain region 51c of a corresponding first semiconductor layer 51. Each of the contact holes CH5 communicate with the drain region 51c of the corresponding first semiconductor layer 51.

Each of the contact holes CH6 are arranged in a portion of the insulating film 45 above a corresponding data line SI₁ or SI₂. Each contact hole CH6 is arranged at a position facing a corresponding gate electrode portion 55a with a corresponding source regions 51a provided therebetween in the X direction. Each contact hole CH6 communicates with the corresponding data line $SI_1$ or $SI_2$.

Two contact holes CH7 are arranged in each portion of the insulating film 45 above a corresponding source region 51a. Each of the contact holes CH7 are arranged between a corresponding data line $SI_1$ or $SI_2$ corresponding to the corresponding pixel 5 and the electrode portion 55b of a corresponding island electrode 55, and face the corresponding electrode portion 55b in the X direction. Each contact hole CH7 communicates with the source region 51a of a corresponding first semiconductor layer 51.

Figure 12:
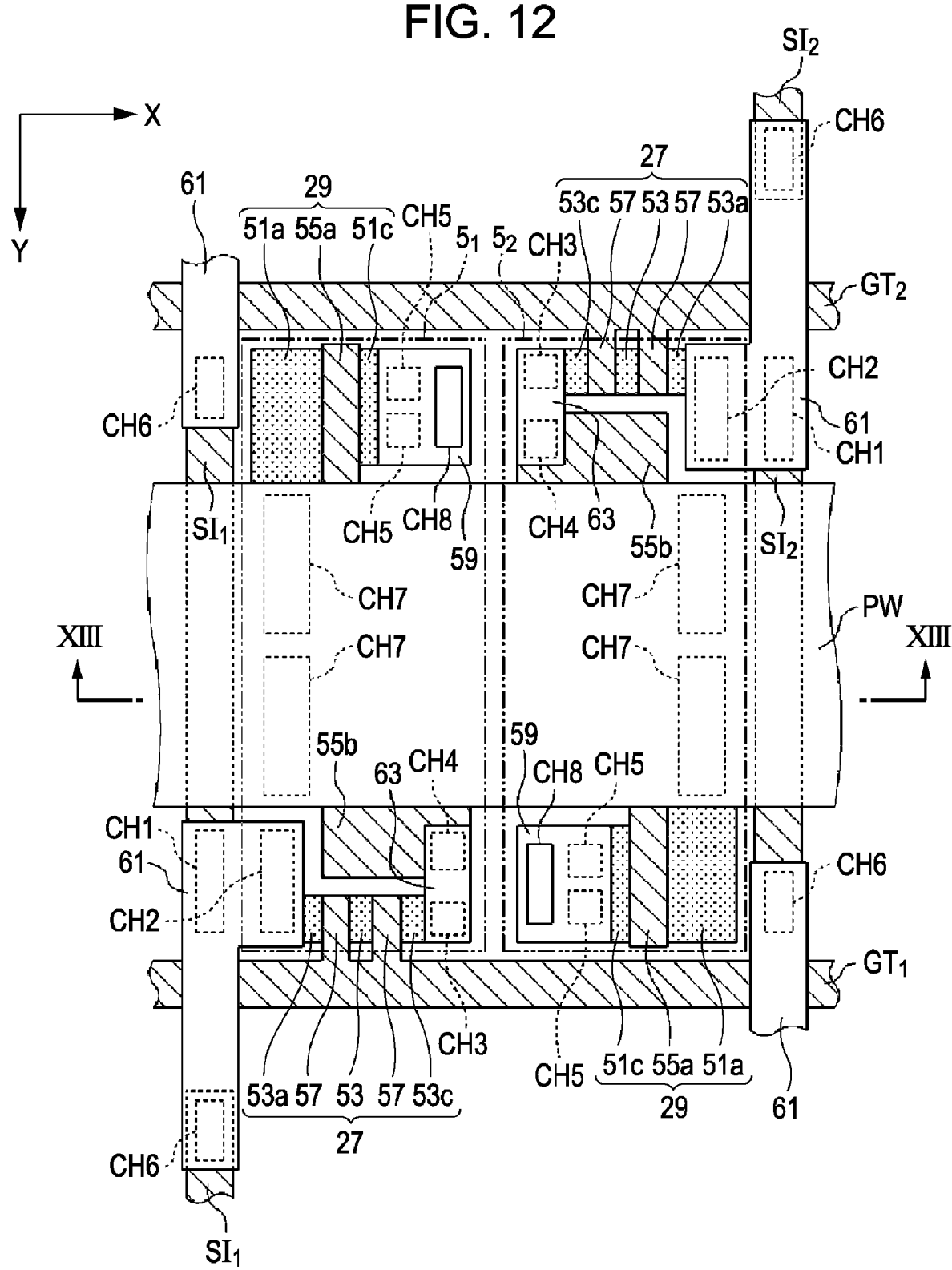
FIG. 12 is a plan view of select transistors, drive transistors, scan lines, data lines, a power line, drain electrodes, and relay electrodes.

As shown in FIG. 12 which is a plan view, the power lines PW, drain electrodes 59, relay electrodes 61, and relay electrodes 63 are arranged on the surface of the insulating film 45, having the contact holes CH1 to CH7, adjacent to the display surface 3.

Each of the power lines PW extends across a corresponding pixel row 23 (see FIG. 3) in the X direction. As shown in FIG. 12, each power line PW has a width in the Y direction which is sufficient to cover two contact holes CH7 aligned in the Y direction. Each power line PW covers the plurality of contact holes CH7 arranged in a corresponding pixel row 23.

In each of the pixels 5, the power lines PW are located between a corresponding select transistor 27 and drive transistor 29. In other words, each of the select transistors 27 faces a corresponding drive transistor 29 with a power line PW provided therebetween. The source region 53a, the channel regions 53b (see FIG. 8), and the drain region 53c of each of the select transistor 27 are located outside a corresponding power line PW. The channel region 51b (see FIG. 8), the drain region 51c, and part of the source region 51a of each of the drive transistors 29 are located outside a corresponding power lines PW in plan.

As shown in FIG. 12, in each of the pixel groups 25, the select transistor 27 located in one of the first and second pixels $5_1$ or $5_2$ is adjacent to the drive transistor 29 located in the adjacent pixel $5_1$ or $5_2$ in the X direction. In the first and second pixels $5_1$ and $5_2$ of each pixel group 25, one select transistor 27 lies on the opposite side of the power line PW than the other select transistor 27 lies in the adjacent first or second pixel $5_1$ and $5_2$ in the Y direction. Similarly, in the first and second pixels $5_1$ and $5_2$ of each pixel group 25, one drive transistor 29 lies on the opposite side of the power line PW opposite than the drive transistor 29 lies in the adjacent first or second pixel $5_1$ and $5_2$ in the Y direction.

Figure 13:
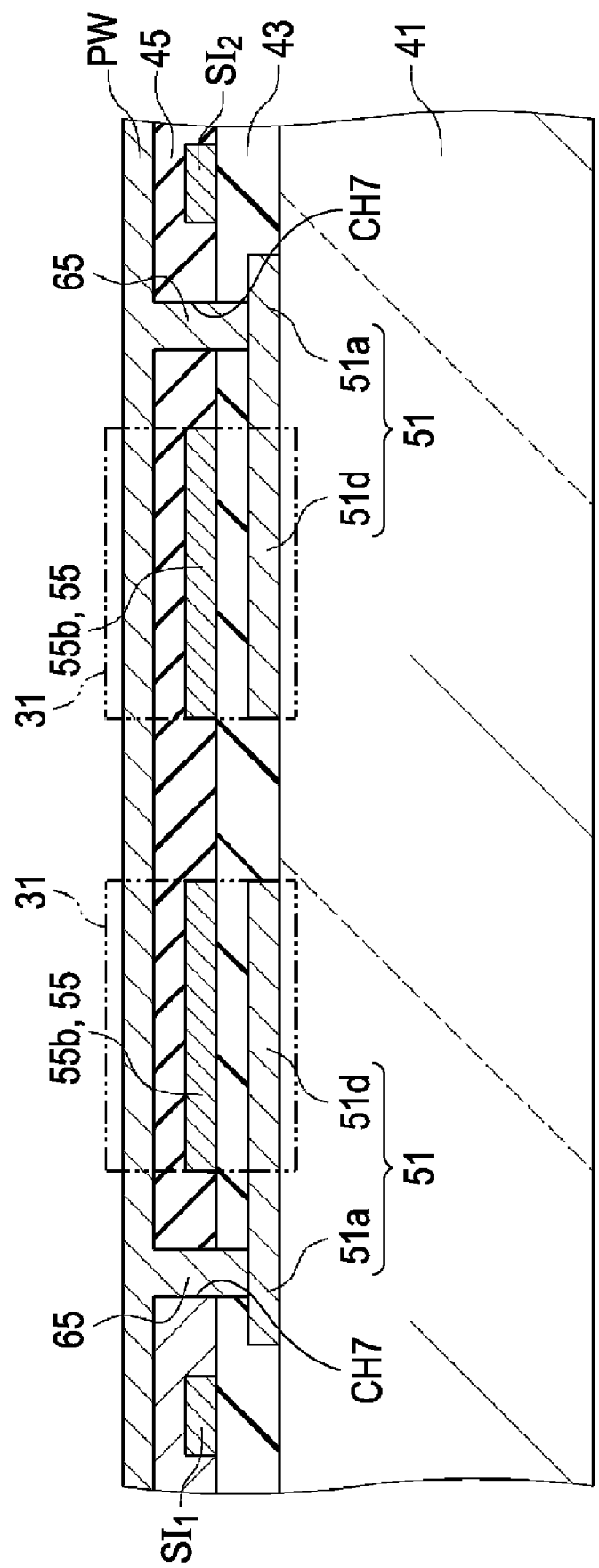
FIG. 13 is a cross-sectional view taken along line XIII-XIII in FIG. 12.

As shown in FIG. 13 which is a cross-sectional view taken along line XIII-XIII in FIG. 12, each of the power lines PW are connected to the source regions 51a of the first semiconductor layers 51 through the contact holes CH7. In the display 1, portions which are located in the contact holes CH7 and between the power lines PW and the source regions 51a are referred to as source electrode portions 65.

As described above, each of the contact holes CH7 are arranged between a corresponding data line $SI_1$ or $SI_2$ corresponding to a pixel 5 and the electrode portion 55b of a corresponding island electrode 55. Thus, each of the source electrode portions 65 are also arranged between a corresponding data lines $SI_1$ and $SI_2$ corresponding to a pixel 5 and the electrode portion 55b of a corresponding island electrode 55.

Each of the capacitor elements 31 are formed in a region where a corresponding power line PW overlaps the electrode portion 55b of a corresponding island electrode 55, and the electrode portion 51d of a corresponding first semiconductor layer 51. Thus, the capacitor elements 31 can be considered to be arranged between the first sub-substrate 41 and the power lines PW. The electrode portions 55b, the electrode portions 51d, and the power lines PW partially comprise the capacitor elements 31.

Figure 14:
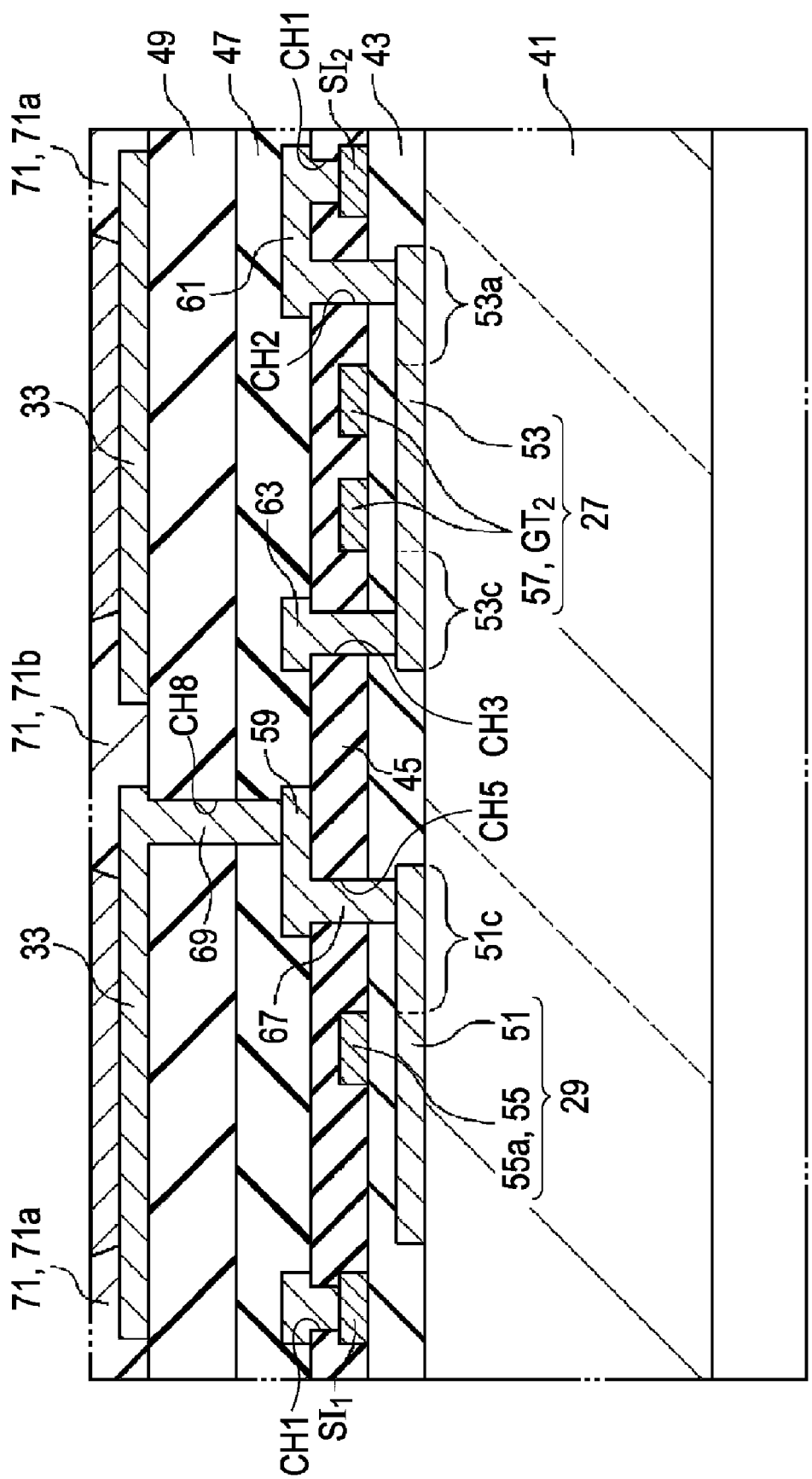
FIG. 14 is an enlarged view of the portion XIV in FIG. 7.

As shown in FIG. 12, each of the drain electrodes 59 are arranged in a corresponding pixel 5 and cover a corresponding contact hole CH5. As shown in FIG. 14, which is an enlarged cross-sectional view taken along line XIV-XIV in FIG. 7, each drain electrode 59 is connected to the drain region 51c of a corresponding first semiconductor layer 51 through the corresponding contact hole CH5. In the display 1, portions which are located in the contact holes CH5 and between the drain electrodes 59 and the drain regions 51c are referred to as connecting portions 67.

As shown in FIG. 12, the relay electrodes 61 are provided so as to correspond to the pixels 5. In two adjacent pixels 5 in the Y direction, each of the relay electrodes 61 extends from the contact hole CH1 of one pixel 5 to the contact hole CH6 of the other pixel 5. Furthermore, in each pixel 5, each relay electrode 61 extends from the contact hole CH1 to the contact hole CH2.

In two adjacent pixels 5 in the Y direction, each relay electrode 61 covers the contact holes CH1 and CH2 of one pixel 5 and the contact hole CH6 of the other pixel 5. Thus, two adjacent data lines $SI_1$ in the Y direction are electrically connected to each other through the corresponding relay electrode 61. Furthermore, two adjacent data lines $SI_2$ in the Y direction are electrically connected to each other through the corresponding relay electrode 61.

Moreover, each of the data lines $SI_1$ are electrically connected to the source region 53a of a second semiconductor layer 53 through a relay electrode 61. Each of the data lines $SI_2$ are electrically connected to the source region 53a of a second semiconductor layer 53 through a relay electrode 61.

Each of the relay electrodes 63 are arranged in a pixel 5 and extend from the contact hole CH3 to the contact hole CH4 arranged in the pixel 5. Each relay electrode 63 covers the contact holes CH3 and CH4 outside the contour of a corresponding power line PW. Thus, the drain region 53c of a second semiconductor layer 53 of each pixel 5 is electrically connected to the electrode portion 55b of a island electrode 55 outside the corresponding power line PW.

Examples of materials which may be used to manufacture the power lines PW, the drain electrodes 59, the relay electrodes 61, and the relay electrodes 63 include metals such as aluminum, copper, molybdenum, tungsten, and chromium, and their alloys. As shown in FIG. 7, surfaces of the drain electrodes 59, the relay electrodes 61, and the relay electrodes 63 adjacent to the display surface 3 are covered with the insulating film 47. The surfaces of the power lines PW adjacent to the display surface 3 are also covered with the insulating film 47.

The surface of the insulating film 47 adjacent to the display surface 3 is covered with the insulating film 49.

The contact holes CH8 are formed in the insulating films 47 and 49.

As shown in FIG. 12, each of the contact holes CH8 are arranged in a corresponding pixel 5. Each contact hole CH8 is located in portions of the insulating films 47 and 49 above a drain electrode 59 so as to communicate with the corresponding drain electrode 59.

Each of the drain electrodes 59 extend in the direction opposite to the gate electrode portion 55a in the X direction. Each contact hole CH8 communicates with the extension of the corresponding drain electrode 59 in plan. Thus, in this example, each of the contact holes CH5 are not formed above the contact holes CH8. Alternatively, each contact hole CH5 may be formed above the contact hole CH8.

As shown in FIG. 7, the pixel electrode 33 is arranged in each of the pixels 5 on the surface of the insulating film 49 where the contact holes CH8 are formed, adjacent to the display surface 3.

Figure 15:
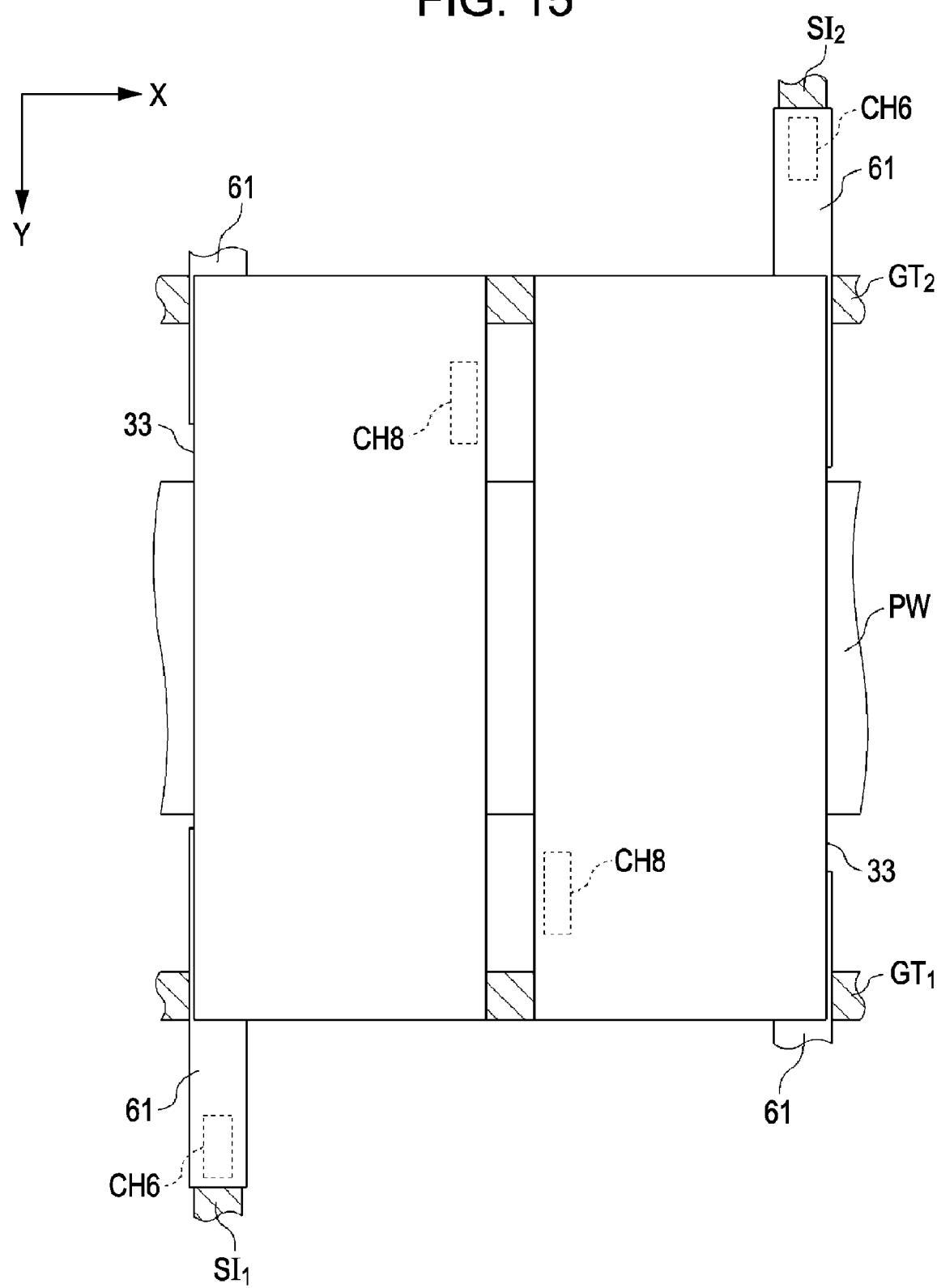
FIG. 15 is a plan view of pixel electrodes.

As shown in FIG. 15 which is a plan view, each of the pixel electrodes 33 extends across a corresponding scan line $GT_1$ and scan line $GT_2$ in the Y direction. Each pixel electrode 33 extends across a corresponding contact hole CH8 and a corresponding data line $SI_1$ or $SI_2$. Each pixel electrode 33 covers the corresponding contact hole CH8.

In the display 1, as shown in FIG. 14, portions which are located in the contact holes CH8 and between the pixel electrodes 33 and the drain electrodes 59 are referred to as connecting portions 69.

Examples of materials which may be used as the pixel electrodes 33 include light-reflective metals, such as silver, aluminum, and copper, and their alloys. In the case where the pixel electrodes 33 serve as positive electrodes, the pixel electrodes 33 are preferably composed of a material having a relatively high work function, for example, silver or platinum. Alternatively, a structure in which the pixel electrodes 33 are composed of, for example, indium tin oxide (ITO) or indium zinc oxide (IZO) with a light-reflective member arranged between the pixel electrodes 33 and the first sub-substrate 41 may be used.

Examples of materials which may be used as the insulating film 47 and 49 include silicon oxide, silicon nitride, and acrylic resins.

Figure 16:
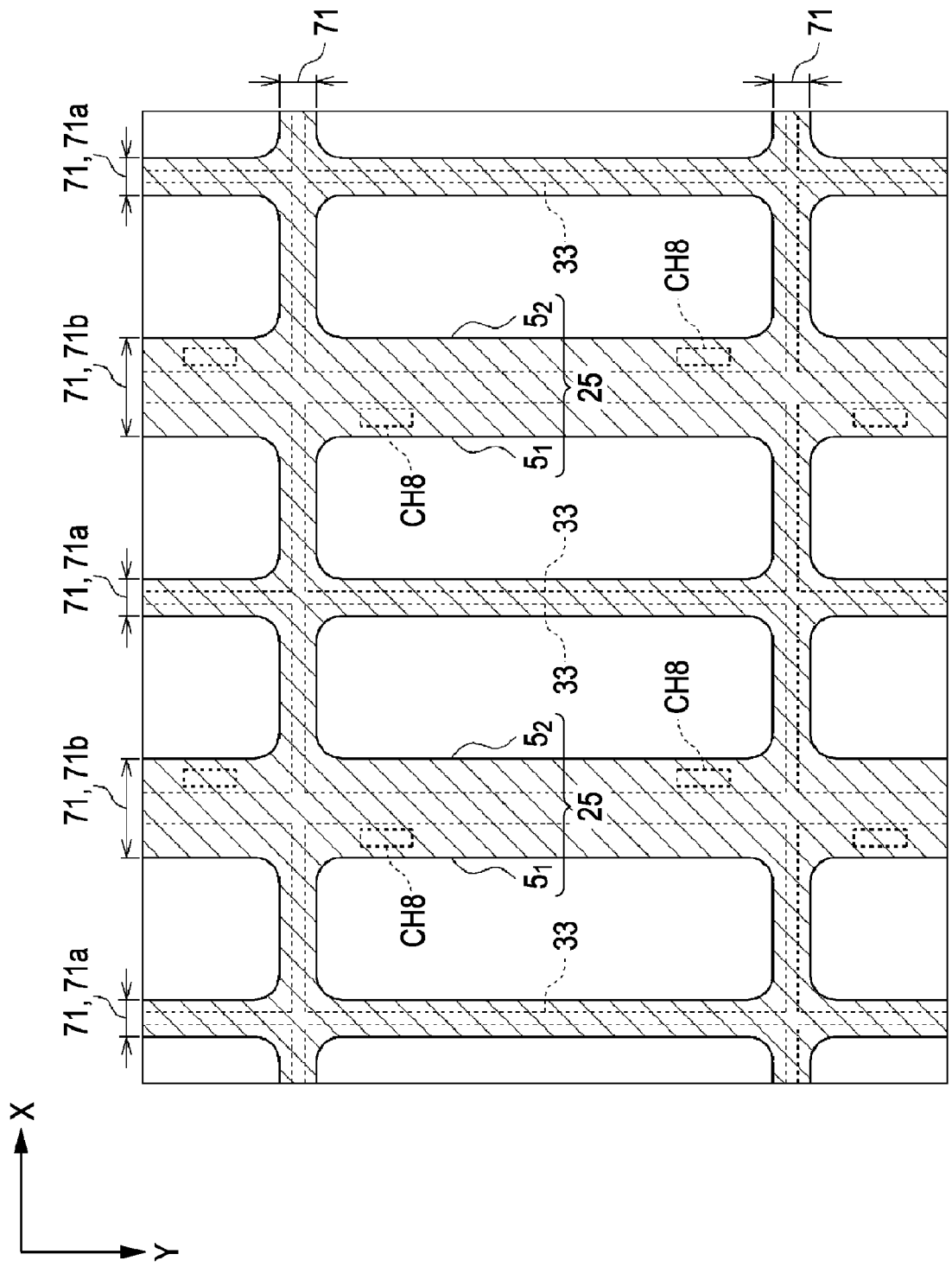
FIG. 16 is a fragmentary plan view of a bank.

As shown in FIG. 7, a bank 71 configured to demarcate the active areas of the pixels 5 is arranged in regions 72 located between adjacent pixel electrodes 33. The bank 71 extends to the insulating film 49 between adjacent pixel electrodes 33. The bank 71 is composed of a resin, such as an acrylic resin or polyimide, containing a material having high light absorbency, for example, carbon black or chromium. As shown in FIG. 16 which is a plan view, the bank 71 is arranged in a lattice pattern.

The bank 71 is arranged across the display region 7. Thus, the active areas of the plurality of pixels 5 in the display region 7 are demarcated by the bank 71. As shown in FIG. 16, perimeters of the pixel electrodes 33 overlap the bank 71 in plan.

The bank 71 has bank portions 71a located between adjacent pixel groups 25 in the X direction and bank portions 71b located between the first pixel $5_1$ and the second pixel $5_2$. The width of each of the bank portions 71b in the X direction is longer than that of each of the bank portions 71a in the X direction.

As shown in FIGS. 14 and 16, the connecting portions 69 of the pixel electrodes 33 and the contact holes CH8 in the pixels 5 are formed above the bank portions 71b in plan. That is, the connecting portions 69 and the contact holes CH8 are masked with the bank portions 71b in plan.

As shown in FIG. 7, the organic layers 35 are arranged on surfaces of the pixel electrodes 33 adjacent to the display surface 3 in regions surrounded by the bank 71.

Each of the organic layers 35 are arranged in a corresponding pixel 5 and include a hole injection sublayer 73, a hole transport sublayer 75, and a light-emitting sublayer 77.

The hole injection sublayers 73 are composed of an organic material. The hole injection sublayers 73 are arranged on surfaces of the pixel electrodes 33 adjacent to the display surface 3 and in regions surrounded by the bank 71 in plan. The hole injection sublayers 73 can be formed by application of a liquid organic material.

Examples of materials which may be used as the hole injection sublayers 73 include mixtures of polythiophene derivatives, such as poly(3,4-ethylenedioxythiophene) (PEDOT), and polystyrene sulfonate (PSS). Examples of materials which may be used as the hole injection sublayers 73 further include polystyrene, polypyrrole, polyaniline, polyacetylene, and derivatives thereof.

The hole transport sublayers 75 are composed of an organic material. The hole transport sublayers 75 are arranged on the surface of the hole injection sublayers 73 adjacent to the display surface 3 in regions surrounded by the bank 71. The hole transport sublayers 75 can be formed by application of a liquid organic material.

The hole transport sublayers 75 may be composed of, for example, a material containing a triphenylamine polymer, such as TFB, represented as the compound 1.

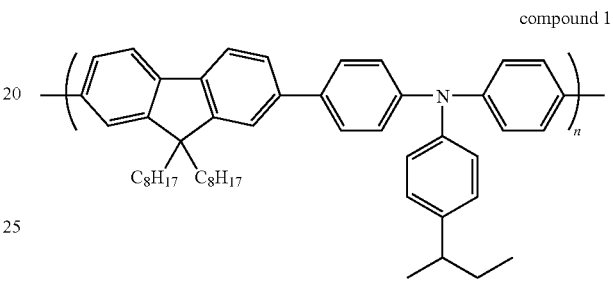

compound 1

The light-emitting sublayers 77 are composed of an organic material. The light-emitting sublayers 77 are arranged on the surface of the hole transport sublayers 75 adjacent to the display surface 3 in regions surrounded by the bank 71. The light-emitting sublayers 77 can be formed by application of a liquid organic material.

The light-emitting sublayers 77 corresponding to the pixels 5r that emit red (R) light may be composed of, for example, CN-PPV represented as the compound 2.

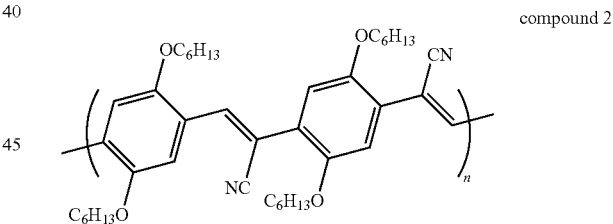

compound 2

The light-emitting sublayers 77 corresponding to the pixels 5g that emit green (G) light may be composed of, for example, a mixture containing F8BT represented as the compound 3 and TFB represented as the compound 1 in a ratio of 1:1.

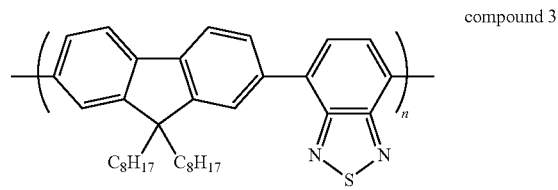

compound 3

The light-emitting sublayers 77 corresponding to the pixels 5b that emit blue (B) light may be composed of, for example, polydioctylfluorene (F8) represented as the compound 4.

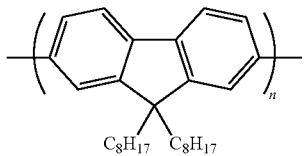

compound 4

As shown in FIG. 7, the common electrode 37 is arranged on the surface of the organic layers 35 adjacent to the display surface 3. The common electrode 37 may be composed of, for example, a light-transmitting material, such as ITO or indium zinc oxide. Alternatively, the common electrode 37 may be formed of, for example, a light-transmitting thin film composed of a magnesium-silver alloy or the like. The organic layers 35 cover the surfaces of the organic layers 35 and the bank 71 adjacent to the display surface 3 across the plurality of pixels 5.

In the display 1, a light-emitting region in each pixel 5 is surrounded by the bank 71 in order to form a region where the pixel electrode 33, organic layers 35, and the common electrode 37 are formed in a stack.

Auxiliary leads 39 are arranged on the surface of the common electrode 37 adjacent to the display surface 3. The auxiliary leads 39 are located closer to the display surface 3 than the common electrode 37 and are arranged above bank portions 71b. Examples of materials that may be used to form the auxiliary leads 39 include metals, such as aluminum, copper, gold, silver, molybdenum, tungsten, and chromium, and their alloys.

The auxiliary leads 39 are electrically connected to the common electrode 37 so as to improve the electrical conduction of the common electrode 37.

The sealing substrate 13 includes a second sub-substrate 81. The second sub-substrate 81 is composed of light-transmitting material such as glass or quartz. The second sub-substrate 81 has an outward surface 82a facing the display surface 3 and an opposite surface 82b facing the bottom surface 15.

A light-shielding film 83 is arranged on the opposite surface 82b of the second sub-substrate 81. The light-shielding film 83 can be composed of, for example, a carbon black-containing resin or a material having high light absorbency, e.g., chromium. The light-shielding film 83 is arranged across the plurality of pixels 5 of the matrix M. That is, the light-shielding film 83 is arranged in a region above on the plurality of pixels 5 constituting the matrix M.

The light-shielding film 83 has openings 85 above the first pixels 5₁ and second pixels 5₂ of the pixel groups 25.

Figure 17:
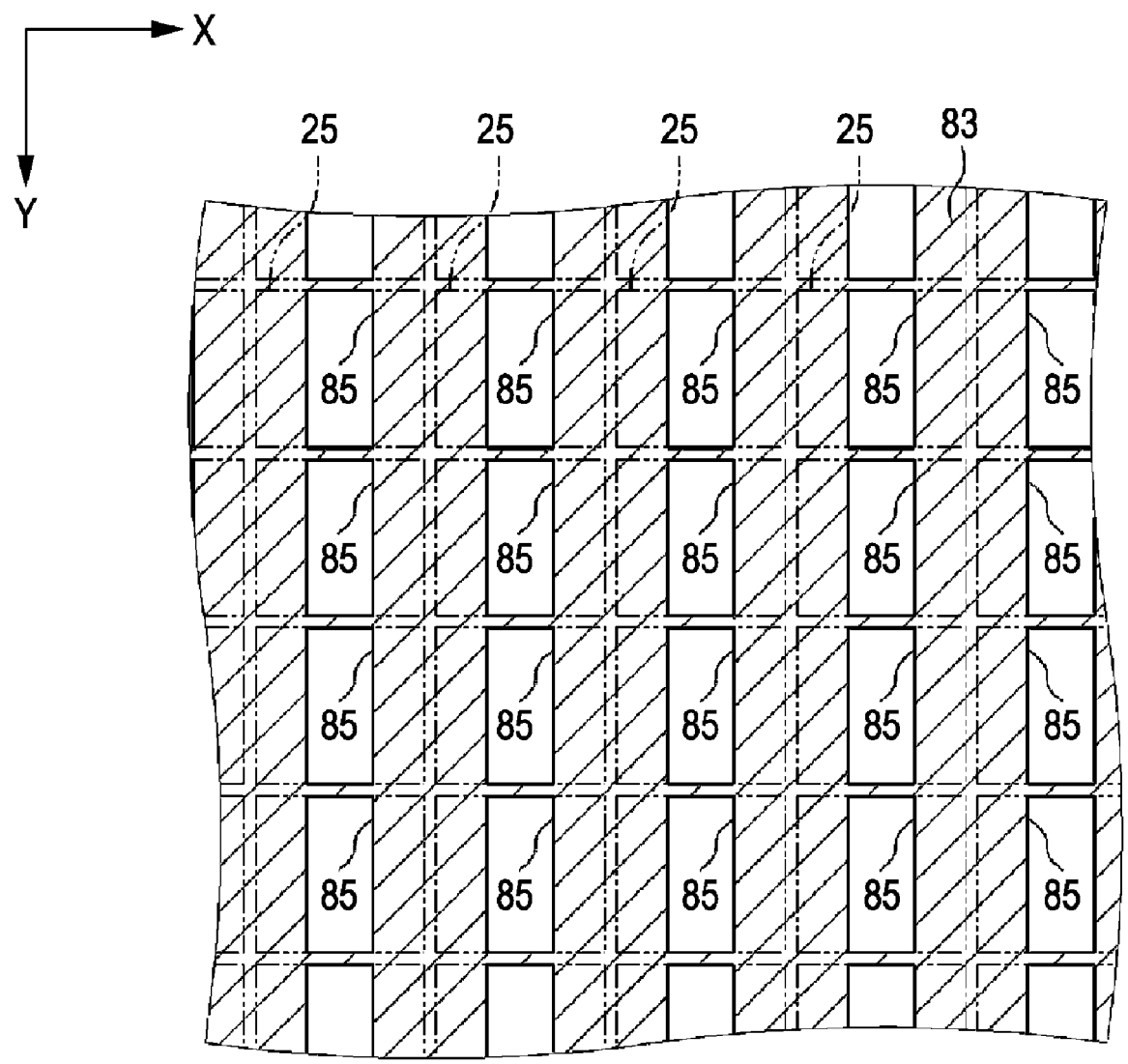
FIG. 17 is a plan view of a light-shielding film and pixel groups.

As shown in FIG. 17 which is a plan view of the light-shielding film 83 and the pixel groups 25, the openings 85 are formed so as to correspond to the pixel groups 25. In FIG. 17, the light-shielding film 83 is hatched in order to facilitate understanding of the structure.

As show in FIG. 7, color filters 87 are arranged on the opposite surface 82b of the second sub-substrate 81, the color filters 87 covering the openings 85 in the bottom surface 15. The color filters 87 are arranged in the respective openings 85.

The color filters 87 can transmit light beams having predetermined wavelength ranges among incident light beams. The color filters 87 are composed of, for example, different-colored resins in response to the pixel groups 25r, 25g, and 25b.

The color filters 87 corresponding to the pixel groups 25r can transmit red (R) light. The color filters 87 corresponding to the pixel groups 25g can transmit green (G) light. The color filters 87 corresponding to the pixel groups 25b can transmit blue (B) light. Hereinafter, when R, G, and B are distinguished among the color filters 87, the expression "color filters 87r, 87g, and 87b" may be used.

In the display 1, the light-emitting sublayers 77 arranged in the pixels 5r emit red (R) light. Red (R) light emitted from the light-emitting sublayers 77 in the pixels 5r passes through the color filters 87r to increase the color purity of red (R) light. Green (G) light emitted from the light-emitting sublayers 77 arranged in the pixels 5g passes through the color filters 87g to increase the color purity of green (G) light. Blue (B) light emitted from the light-emitting sublayers 77 arranged in the pixels 5b passes through the color filters 87b to increase the color purity of blue (B) light.

A coating layer 89 is arranged on surfaces of the light-shielding film 83 and the color filters 87 adjacent to the bottom surface 15. The coating layer 89 is composed of, for example, a light-transmitting resin and covers the light-shielding film 83 and the color filters 87 from the bottom 15 surface.

A resin layer 93 is arranged on the surface of the coating layer 89 adjacent to the bottom surface 15. The resin layer 93 is composed of, for example, a light-transmitting resin, such as an acrylic resin or an epoxy resin. The resin layer 93 has prismatic portions 95a and 95b corresponding to the pixels 5. The prismatic portions 95a in the display 1 correspond to the first pixels 5₁. The prismatic portions 95b correspond to the second pixels 5₂.

In the sealing substrate 13 having the foregoing structure and the element substrate 11, the resin layer 93 is bonded to the common electrode 37 with an adhesive 97 so that that the prismatic portions 95a and 95b of the resin layer 93 face the common electrode 37.

In the display 1, the seal 17 shown in FIG. 2 is held by the first surface 42a of the first sub-substrate 41 and the opposite surface 82b of the second sub-substrate 81 shown in FIG. 7. That is, in the display 1, the adhesive 97 is sealed with the first sub-substrate 41, the second sub-substrate 81, and the seal 17. The seal 17 may be arranged between the resin layer 93 and the common electrode 37. In this case, the adhesive 97 can be considered to be sealed with the element substrate 11, the sealing substrate 13, and the seal 17.

The adhesive 97 is also filled into the prismatic portions 95a and 95b of the resin layer 93. The adhesive 97 can comprise a material having optical transparency and a refractive index which is different from that of the resin layer 93. Thus, light emanating from the light-emitting sublayers 77 in the pixels 5 toward the prismatic portions 95a and 95b can be refracted through the prismatic portions 95a and 95b.

In the display 1, the resin layer 93 has a refractive index which is higher than that of the adhesive 97. In addition, the prismatic portions 95a and 95b have shapes such that light emanating from the light-emitting sublayers 77 in the pixels 5 is refracted toward the openings 85.

The display 1 having the foregoing structure controls display by allowing the light-emitting sublayer 77 in each pixel 5 to emit light. The emitting state of the light-emitting sublayer 77 in each pixel 5 can be changed by controlling the current flowing through the organic layers 35 using the corresponding drive transistor 29.

As shown in FIG. 6, a control signal $CS_1(h)$ is supplied to the scan line $GT_1(h)$. Similarly, a control signal $CS_2(h)$ is also supplied to the scan line $GT_2(h)$. The control signal $CS_1(h)$ and the control signal $CS_2(h)$ are alternately supplied. That is, after a control signal $CS_1(1)$ is supplied to a scan line $GT_1(1)$, a control signal $CS_2(1)$ is supplied to a scan line $GT_2(1)$.

An image signal $DS_1(j)$ is supplied as a parallel signal to the data line $SI_1(j)$. Similarly, an image signal $DS_2(j)$ is supplied as a parallel signal to the data line $SI_2(j)$. The image signal $DS_1(j)$ and the image signal $DS_2(j)$ are alternately supplied. That is, after image signals $DS_1(1)$ to $DS_1(n)$ are supplied to data lines $SI_1(1)$ to $SI_1(n)$, image signals $DS_2(1)$ to $DS_2(n)$ are supplied to data lines $SI_2(1)$ to $SI_2(n)$.

Figure 18:
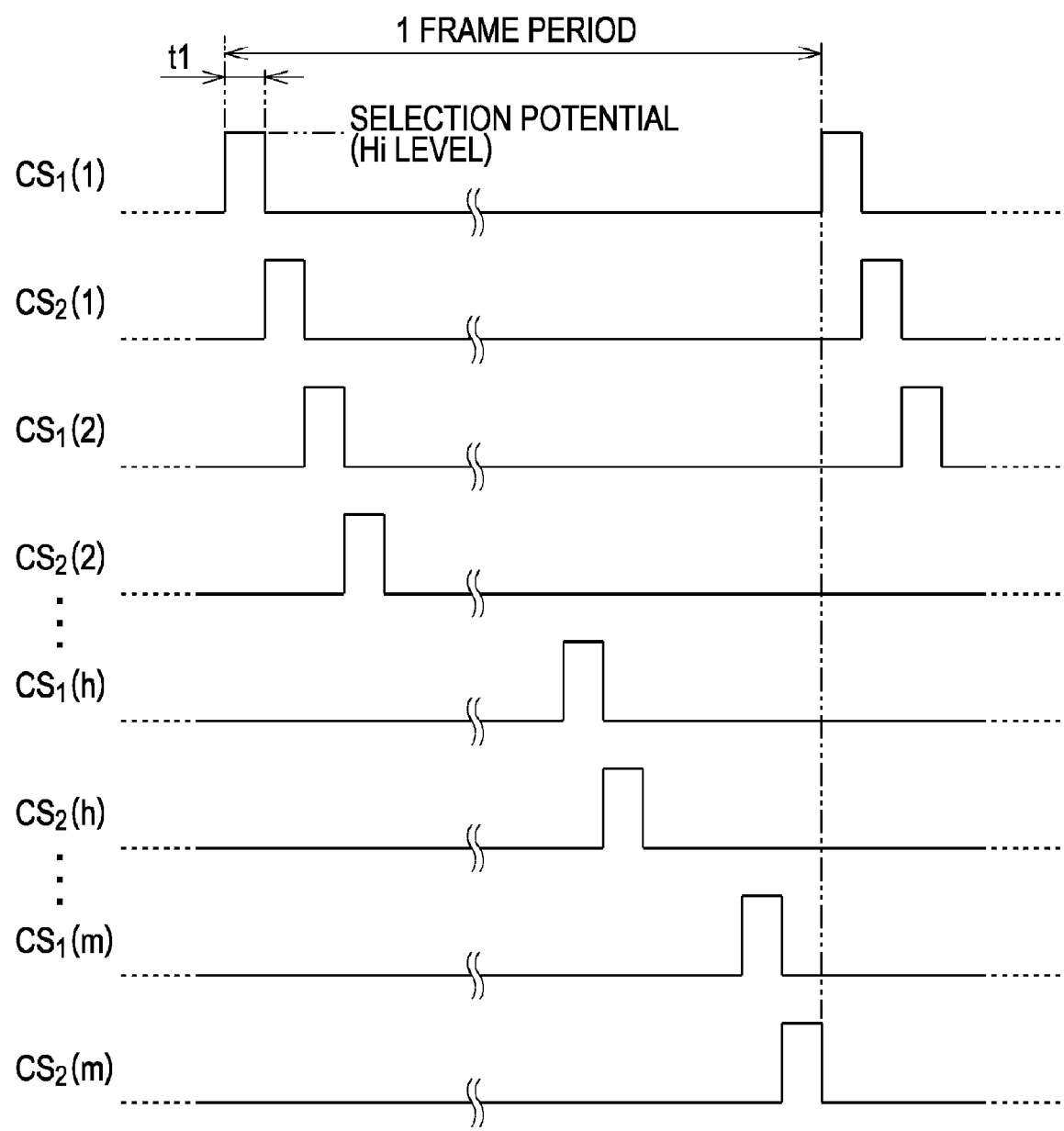
FIG. 18 is a timing chart of control signals supplied to scan lines.

As shown in FIG. 18, each of the control signals $CS_1(h)$ and the control signals $CS_2(h)$ are maintained at a selective potential with a high level one time for a period of t1 during the frame period. Only one of the control signals $CS_1(h)$ and the control signals $CS_2(h)$ can have the selective potential at any given timing.

When the selective potential is applied to the scan line $GT_1(h)$, the select transistors 27 in the plurality of first pixels $5_1$ corresponding to the scan line $GT_1(h)$ are turned on. In this case, image signals $DS_1(1)$ to $DS_1(n)$ supplied to the data lines $SI_1(L)$ to $SI_1(n)$ are supplied to the gate electrode portions 55a and the electrode portions 55b (see FIG. 12) of the drive transistors 29 through the select transistors 27. That is, in the first pixels $5_1$, a potential is applied to each of the gate electrode portions 55a and the electrode portions 55b in response to the image signal $DS_1(j)$.

Similarly, when the selective potential is applied to the scan line $GT_2(h)$, the select transistors 27 in the plurality of second pixels $5_2$ corresponding to the scan line $GT_2(h)$ are turned on. In this case, image signals $DS_2(1)$ to $DS_2(n)$ supplied to the data lines $SI_2(1)$ to $SI_2(n)$ are supplied to the gate electrode portions 55a and the electrode portions 55b (see FIG. 12) of the drive transistors 29 through the select transistors 27. That is, a potential in response to the image signal $DS_2(j)$ is applied to each of the gate electrode portions 55a and the electrode portions 55b of the second pixels $5_2$.

At this point, currents flow from the power line PW(h) to the drain regions 51c through the source regions 51a and the channel regions 51b in response to the potentials at the gate electrode portions 55a of the drive transistors 29.

The currents from the power line PW(h) flow into the organic layers 35 (see FIG. 7) through the drain electrodes 59 and the pixel electrodes 33.

Meanwhile, charge is accumulated between the electrode portions 55b and the power line PW(h) (see FIG. 13) and between the electrode portions 55b and the electrode portions 51d, so that the potentials at the gate electrode portions 55a of the drive transistors 29 are maintained for a certain period. Thus, the currents continue to flow through the organic layers 35 during the period for which the potentials at the gate electrode portions 55a are held.

In this way, the currents flow through the organic layers 35 in response to the image signal $DS_1(j)$ and the image signal $DS_2(j)$, so that light emanating from the light-emitting sublayer 77 in each pixel 5 can be controlled so as to have luminance in the display 1 in response to the potential of the image signal $DS_1(j)$. The display 1 can display a gray-scale image.

In the display 1, the image signal $DS_1(j)$ and the image signal $DS_2(j)$ can be supplied at different timings for each of the first and second pixels $5_1$ and $5_2$. Thus, the image signal $DS_1(j)$ corresponding to the first image and the image signal $DS_2(j)$ corresponding to the second image can be separately supplied. Hence, the need to supply the image signal $DS_1(j)$ corresponding to the first image and the image signal $DS_2(j)$ corresponding to the second image in a combined signal at the same time can be omitted.

The display 1 includes the light-shielding film 83 having the openings 85 corresponding to the pixel groups 25 as described above. Light from the light-emitting sublayers 77 in the first pixels $5_1$ travels toward the display surface 3 through the openings 85.

Figure 19:
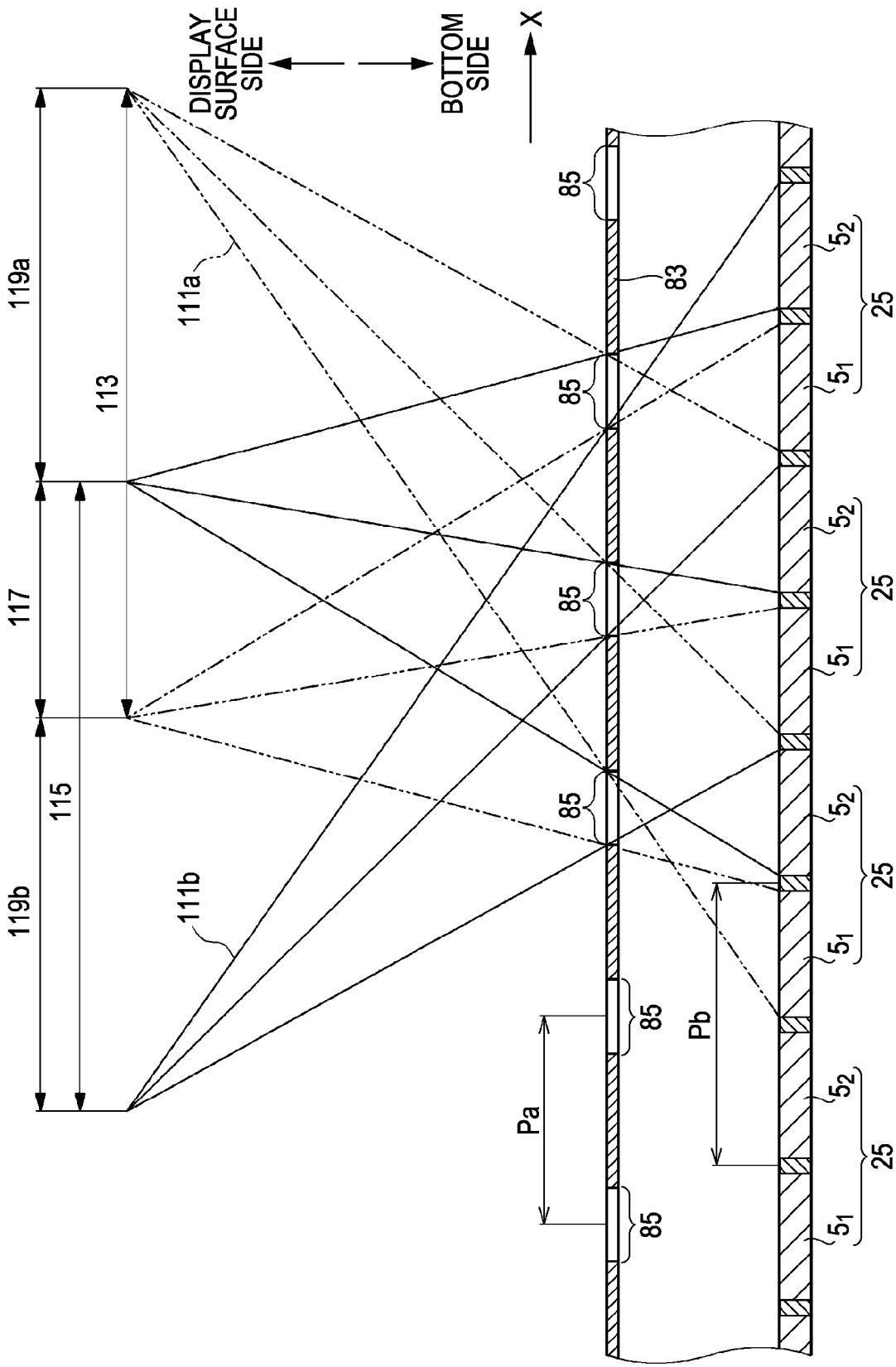
FIG. 19 is a schematic cross-sectional view of a plurality of pixel groups and a light-shielding film.

In this case, as shown in FIG. 19 which is a schematic cross-sectional view of the plurality of pixel groups 25 and the light-shielding film 83, light beams 111a emitted from the first pixels $5_1$ toward the display surface 3 arrive at a first range 113 through the openings 85.

Furthermore, light beams 111b emitted from the second pixels $5_2$ toward the display surface 3 arrive at a second range 115 through the openings 85. FIG. 19 is a cross-sectional view taken along line XIX-XIX in FIG. 1.

The light beams 111a from the first pixels $5_1$ can be seen from the first range 113 through the openings 85. The light beams 111b from the second pixels $5_2$ can be seen from the second range 115 through the openings 85. When a viewing point is located in the first range 113, the first image formed by the light beams 111a from the plurality of first pixels $5_1$ can be seen. When the viewing point is located in the second range 115, the second image formed by the light beams 111b from the plurality of second pixels $5_2$ can be seen. That is, the first image is displayed in the first range 113, and the second image is displayed in the second range 115, which is separate from the first range 113. Thus the display 1 is a multiple-view directional display.

There is a subrange 117 in which the first range 113 and the second range 115 overlap each other. A superimposed image of the first and second images may be seen in the subrange 117. Only the first image can be seen in a subrange 119a (hereinafter, referred to as a "suitable viewing range 119a") defined by excluding the subrange 117 from the first range 113. Only the second image can be seen in a subrange 119b (hereinafter, referred to as a "suitable viewing range 119b") defined by excluding the subrange 117 from the second range 115.

The display 1 has a structure such that the light beams 111a emitted from the plurality of first pixels $5_1$ intersect at both ends of the first range 113 and that the light beams 111b emitted from the plurality of second pixels $5_2$ intersect at both ends of the second range 115. This structure can be made by setting the distance Pa between adjacent openings 85 in the X direction to be smaller than the distance Pb between adjacent pixel groups 25 in the X direction.

Thereby, a uniform amount of light seen at any viewing point located in the suitable viewing range 119a can be observed among the plurality of first pixels $5_1$. Similarly, a uniform amount of light seen at any viewing point located in the suitable viewing range 119b can be observed among the plurality of first pixels $5_1$.

In the display 1, the light-shielding film 83 comprises a light-shielding layer. The pixel electrodes 33 comprise first electrodes. The common electrode 37 comprises a second electrode. The drive transistors 29 comprise transistors. The select transistors 27 comprise switching elements. The scan lines $GT_1$ and the scan lines $GT_2$ comprise control lines. The data lines $SI_1$ and the data lines $SI_2$ comprise signal lines. The source electrode portions 65 and the contact holes CH7 comprise connecting portions. The connecting portions 69 and the contact holes CH8 comprise second connecting portions. The bank portions 71b comprise second light-shielding layers. The X direction corresponds to a first direction. The Y direction corresponds to a second direction.

In the display 1, the light-shielding film 83 is arranged on the second sub-substrate 81. That is, the light-shielding film 83 is arranged between the first sub-substrate 41 and the second sub-substrate 81. Thus, the distance between the plurality of pixels 5 and the light-shielding film 83 can be reduced when compared with the case where the light-shielding film 83 is located outside the element substrate 11 and the sealing substrate 13. Thus, the suitable viewing range 119*a* and the suitable viewing range 119*b* in the directional display mode can be easily extended.

In the display 1, the power lines PW extend in the X direction. Thus, for example, the distance between adjacent pixels 5 in the X direction can be easily reduced when compared with the case where the power lines PW extend in the Y direction between adjacent pixels 5 in the X direction. This can easily increase the pixel density in the X direction, thereby easily resulting in higher definition in the directional display mode.

In the display 1, a top-emission organic EL device is used so that light from the light-emitting sublayers 77 can emerge from the display surface 3 through the sealing substrate 13.

If a bottom-emission EL device in which light from the light-emitting sublayers 77 emerges from the first sub-substrate 41 of the element substrate 11 is used, the first sub-substrate 41 is located between the light-emitting sublayers 77 and the light-shielding film 83. Thus, in the bottom-emission EL device, it is difficult to reduce the distance between the light-emitting sublayers 77 and the light-shielding film 83.

In the display 1, since the top-emission EL device is used, the distance between the light-emitting sublayers 77 and the light-shielding film 83 can be easily reduced.

In the display 1, the select transistors 27 and the drive transistors 29 are located at positions closer to the bottom than the light-emitting sublayers 77. Meanwhile, light from the light-emitting sublayers 77 is emitted from the display surface 3 through the sealing substrate 13. That is, the select transistors 27 and the drive transistors 29 do not preclude the travel of the light from the light-emitting sublayers 77 toward the display surface 3, so that the use efficiency of light from the light-emitting sublayers 77 can be easily increased. Furthermore, the degree of flexibility of the arrangement of the select transistors 27, the drive transistors 29, and the like can be easily improved.

In the display 1, the resin layer 93 is located between the light-emitting sublayers 77 and the light-shielding film 83. The thickness of the resin layer 93 can be easily adjusted when compared to brittle materials such as glass and quartz. In the display 1, thus, the suitable viewing ranges 119*a* and 119*b* can be easily adjusted by adjusting the thickness of the resin layer 93.

In the display 1, the resin layer 93 has the prismatic portions 95*a* and 95*b*. Thus, light from the light-emitting sublayers 77 can be easily introduced to the openings 85, so that the light use efficiency can be improved.

In the display 1, each of the plurality of light-emitting sublayers 77 emits red (R) light, green (G) light, or blue (B) light in a corresponding pixel 5, so that color images can be displayed in the directional display mode.

In the display 1, the color filter 87 is arranged in each opening 85. The openings 85 correspond to the pixel groups 25. Thus, one color filter 87 can be used for both first and second pixels 5$_1$ and 5$_2$ which comprise the pixel groups 25.

The color filters 87 are arranged in the openings 85, so that the thickness of the display 1 can be easily reduced.

In the display 1, the capacitor elements 31 are located between the first sub-substrate 41 and the power lines PW and above the power lines PW in plan, so that the region of each pixel 5 can be easily reduced. This can more easily increase the pixel density, thereby more easily resulting in higher definition in the directional display mode.

In the display 1, the select transistor 27 of each pixel lies on the opposite side of the power line PW than the drive transistor 29 in the Y direction. Thus, the capacitor element 31 can be easily arranged between the select transistor 27 and the drive transistor 29, so that the region in each pixel 5 can be easily reduced.

In the display 1, the source region 51*a*, the channel region 51*b*, and the drain region 51*c* of each drive transistor 29 are aligned in the X direction. The source region 53*a*, the channel regions 53*b*, and the drain region 53*c* of each select transistor 27 are aligned in the X direction. Thus, a region between the select transistor 27 and the drive transistor 29 can be easily extended. Hence, the capacitor element 31 can be more easily arranged between the select transistor 27 and the drive transistor 29.

The island electrode 55 of each drive transistor 29 has a gate electrode portion 55*a* and an electrode portion 55*b*. The first semiconductor layer 51 has the electrode portion 51*d*. The electrode portion 55*b* and the electrode portion 51*d* face each other and are formed above the corresponding power line PW. The electrode portion 55*b* is electrically connected to the drain region 53*c* of the corresponding select transistor 27. The electrode portion 51*d* is electrically connected to the power line PW. Thus, the electrode portion 55*b*, the electrode portion 51*d*, and the power line PW can partially constitute the capacitor element 31.

Meanwhile, the gate electrode portion 55*a* of the island electrode 55, the source region 51*a*, the channel region 51*b*, and the drain region 51*c* of the first semiconductor layer 51 comprise the drive transistor 29. That is, the drive transistor 29 and the capacitor element 31 of the display 1 can be shared. Thus, the region in each pixel 5 can be more easily reduced, thereby more easily resulting in higher definition in the directional display mode.

The drain region 51*c* of each first semiconductor layer 51 of the display 1 is arranged outside the corresponding power line PW. The drain region 51*c* of each first semiconductor layer 51 is electrically connected to the corresponding pixel electrode 33 outside the power line PW. Thus, each drive transistor 29 can be electrically connected to the corresponding pixel electrode 33 without being inhibited by the power line PW.

One drain region 51*c* of the first semiconductor layer 51 in the first and second pixels 5$_1$ and 5$_2$ of one pixel group 25 lies on the opposite side of the power line PW than the other drain region 51*c* of the first semiconductor layer 51. Thus, the distance between the drain regions 51*c* of the first semiconductor layers 51 can be easily increased in the first and second pixels 5$_1$ and 5$_2$. Hence, the distance between the contact holes CH8 can be easily increased in the first and second pixels 5$_1$ and 5$_2$. Thereby, in the first and second pixels 5$_1$ and 5$_2$, the region of each contact hole CH8 can be easily increased. Therefore, a region of each connecting portion 69 can be easily increased, so that the electrical conduction of the connecting portion 69 can be easily improved.

In the display 1, the scan lines GT$_1$ correspond to the first pixels 5$_1$. The scan lines GT$_2$ correspond to the second pixels 5$_2$. Thus, the plurality of select transistors 27 can be turned on at different timings for each of the first and second pixels 5$_1$ and 5$_2$. Thereby, the image signal DS$_1$(j) and the image signal DS$_2$(j) can be supplied at different timings for each of the first and second pixels 5$_1$ and 5$_2$. Thus, the image signal DS$_1$(j) corresponding to the first image and the image signal DS$_2$(j) corresponding to the second image can be treated separately.

The select transistors 27 and the drive transistors 29 of the first and second pixels 5$_1$ and 5$_2$ of one pixel group 25 are located between the data lines SI$_1$ and SI$_2$ corresponding to the first and second pixels $5_1$ and $5_2$, respectively. Thus, the distance between the first and second pixels $5_1$ and $5_2$ can be easily reduced in the X direction.

In the display 1, each power line PW extends across adjacent pixel groups 25 in the X direction. Two data lines $SI_1$ and $SI_2$ extend in the Y direction between adjacent pixel groups 25 in the X direction. The corresponding power line PW extends across the two data lines $SI_1$ and $SI_2$ in the X direction.

Parasitic capacitance is easily formed between the two data lines $SI_1$ and $SI_2$. In the display 1, since the power line PW extends across the two data lines $SI_1$ and $SI_2$, capacitance can be easily formed between the power line PW and the data lines $SI_1$ and between the power line PW and the data lines $SI_2$. This can reduce the electrical interference between the two data lines $SI_1$ and $SI_2$, thereby improving the quality of the display.

The contact holes CH7 and the source electrode portions 65 of each pixel 5 are located between the electrode portion 55b of the island electrode 55 and the data line $SI_1$ or $SI_2$. This can reduce the electrical interference between the capacitor element 31 and each of the data lines $SI_1$ and $SI_2$, thereby improving the quality of display.

In the display 1, the connecting portions 69 of the pixel electrodes 33 and the contact holes CH8 are formed above the bank portions 71b. Thus, the connecting portions 69 and the contact holes CH8 can be easily masked with the bank portions 71b.

In the display 1, the auxiliary leads 39 are formed over the bank 71. Thus, the auxiliary leads 39 do not preclude the light from the light-emitting sublayers 77 from emitting toward the display surface 3. Hence, the auxiliary leads 39 can be made from a light-shielding material. Furthermore, each of the auxiliary leads 39 can have a large thickness, thereby improving the electrical conduction of the auxiliary leads 39.

In the display 1, the width of each of the bank portions 71b in the X direction is longer than that of each of the bank portions 71a in the X direction. Each of the bank portions 71b are located between the first and second pixels $5_1$ and $5_2$ of one pixel group 25. That is, the bank portions 71b are formed above on the openings 85.

A larger width dimension of each bank portion 71b in the X direction can result in a reduction in the size of the subrange 117 where the first image is formed above the second image in the directional display mode. Thus, the suitable viewing ranges 119a and 119b of display 1 can be easily extended in the directional display mode.

The auxiliary leads 39 are arranged in regions above the bank portions 71b. Thus, the width of each auxiliary lead 39 in the X direction can be increased as compared to the case where the auxiliary leads 39 are arranged in regions above the bank portions 71a. This can further improve the electrical conduction of the auxiliary leads 39.

In the display 1, N-channel TFT elements are used as the select transistors 27, and P-channel TFT elements are used as the drive transistors 29. However, the select transistors 27 are not limited to the N-channel TFT elements and may be formed of P-channel TFT elements. Similarly, the drive transistors 29 are not limited to the P-channel TFT elements and may be formed of N-channel TFT elements.

While a structure in which the drain region 53c of each select transistor 27 is electrically connected to the electrode portion 55b of the corresponding drive transistor 29 is described above, the structure between each select transistor 27 and the corresponding drive transistor 29 is not limited to the configuration described above. Rather, a structure in which a capacitor element is arranged between the drain region 53c of each select transistor 27 and the electrode portion 55b of the corresponding drive transistor 29 may be used.

In the example described above, an application method of liquid organic materials is used to form the organic layers 35. However, the formation of the organic layers 35 is not limited to the application method. For example, an evaporation method which utilizing vapor deposition technology may also be employed.

Figure 20:
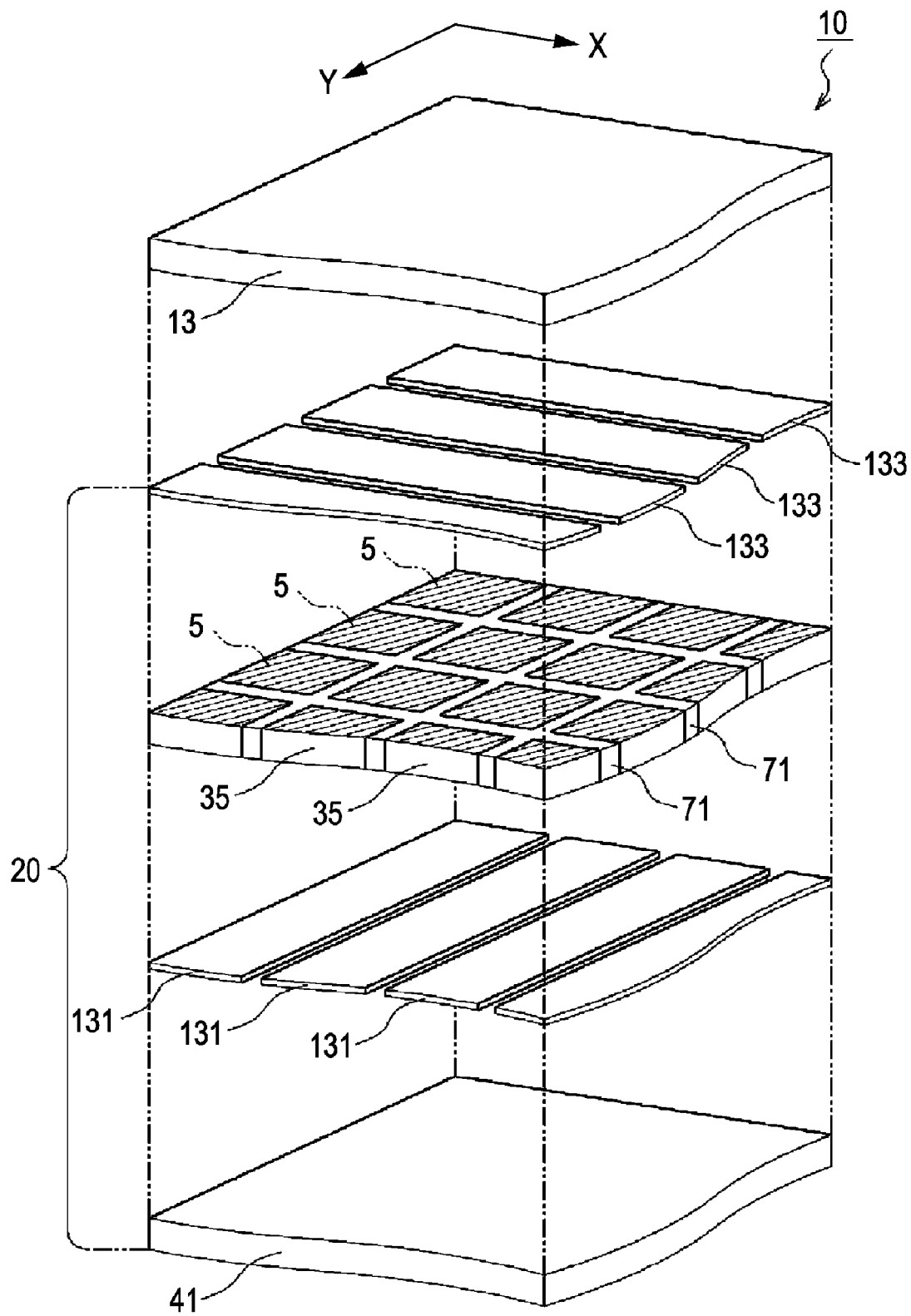
FIG. 20 is an exploded perspective view of main components of a display.

An active matrix display in which the select transistor 27 and the drive transistor 29 are arranged in each pixel 5 is used as an example. However, the configuration of the display 1 is not so limited, and a passive matrix display may also be used. As shown in FIG. 20, in a passive matrix display 10, an element substrate 20 includes the first sub-substrate 41, a plurality of first electrodes 131, the organic layers 35, the bank 71, and a plurality of second electrodes 133. The display 10 has the same structure as the display 1, except for the element substrate 20. Hereinafter, thus, elements corresponding to those of the display 1 are designated using the same reference numerals, and detailed descriptions are not repeated.

The first electrodes 131 are located between the first sub-substrate 41 and the organic layers 35. Each of the first electrodes 131 forms a strip extending in the Y direction. The plurality of first electrodes 131 are aligned in the X direction at predetermined intervals.

The second electrodes 133 are located between the organic layers 35 and the sealing substrate 13. Each of the second electrodes 133 forms a strip extending in the X direction. The plurality of second electrodes 133 are aligned in the Y direction at predetermined intervals.

The first electrodes 131 intersect the second electrodes 133 with the organic layers 35 provided therebetween. In the display 10, each of the pixels 5 can be defined as a region surrounded by the bank 71 in plan where a corresponding first electrode 131 and second electrode 133 formed above the bank 71.

Both the display 1 and the display 10 have a color filter 87 arranged in each opening 85, but the structure is not limited thereto. A structure without the color filter 87 may also be used. In each of the display 1 and the display 10, each of the plurality of light-emitting sublayers 77 emit red (R) light, green (G) light, or blue (B) light in a corresponding pixel 5, so that color display can be performed even when the color filter 87 is not arranged.

In both the display 1 and the display 10 described above, each of the plurality of light-emitting sublayers 77 emit red (R) light, green (G) light, or blue (B) light in a corresponding pixel 5, but the structure of the displays 1 and 10 are not so limited. Rather, the display 1 may have a structure including white-light-emitting sublayers 77 in place of the light-emitting sublayers 77 capable of emitting red (R), green (G), or blue (B) light. Since the display 1 includes color filters 87r, 87g, and 87b arranged in the respective openings 85, color display can be performed even when all the light-emitting sublayers 77 emit white light.

In both the display 1 and the display 10, the organic layers 35 can be formed across the plurality of pixels 5. When the organic layers 35 are formed across the plurality of pixels 5, each of the pixels 5 can be defined as a region between the corresponding pixel electrode 33 and common electrode 37.

Figure 21:
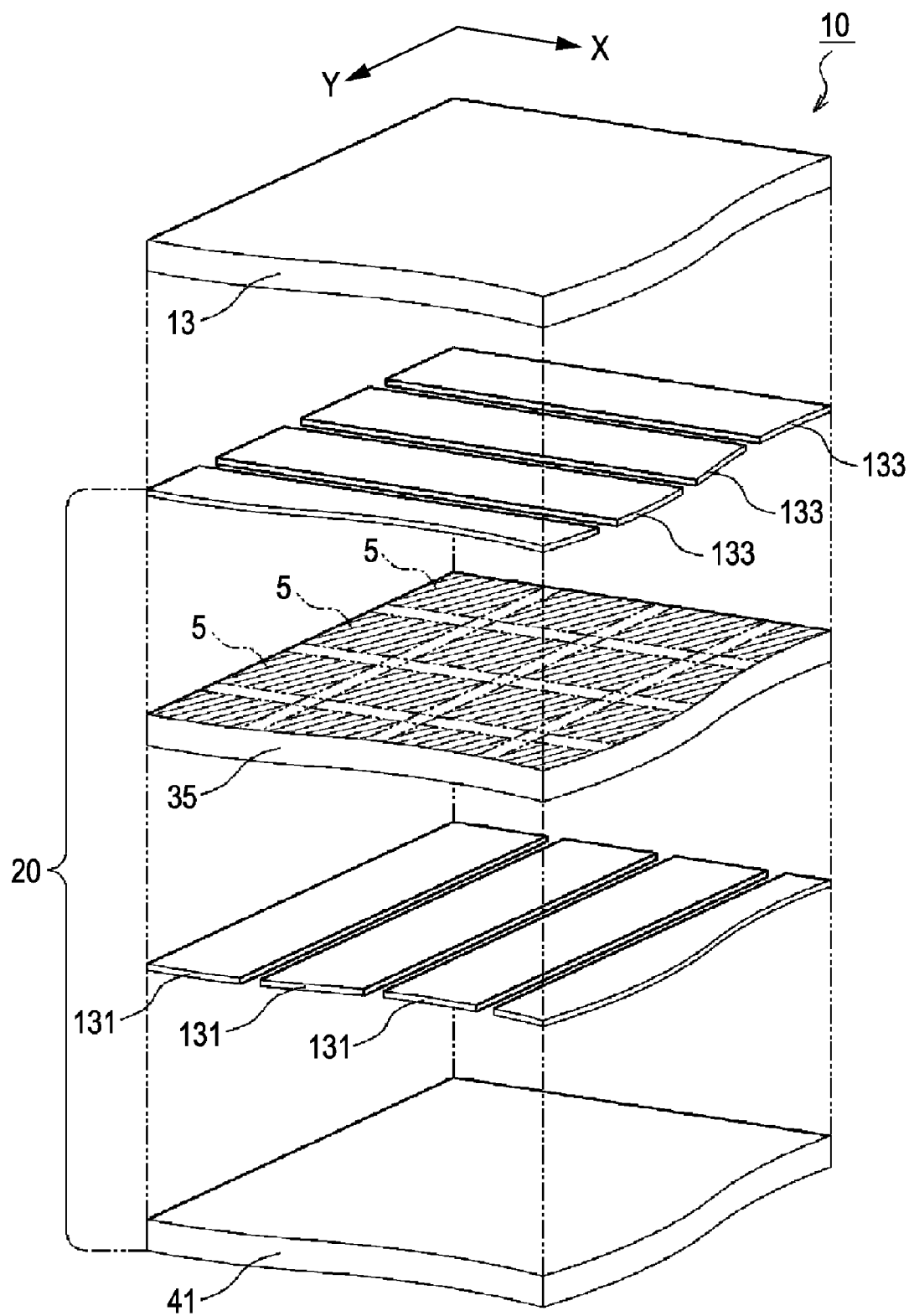
FIG. 21 is an exploded perspective view of main components of a display.

When the organic layers 35 are formed across the plurality of pixels 5 in the display 10, each of the pixels 5 can be defined as a region between a first electrode 131 and a second electrode 133, as shown in FIG. 21.

In FIGS. 20 and 21, the pixels 5 are hatched in order to facilitate understanding of the structure.

Figure 22:
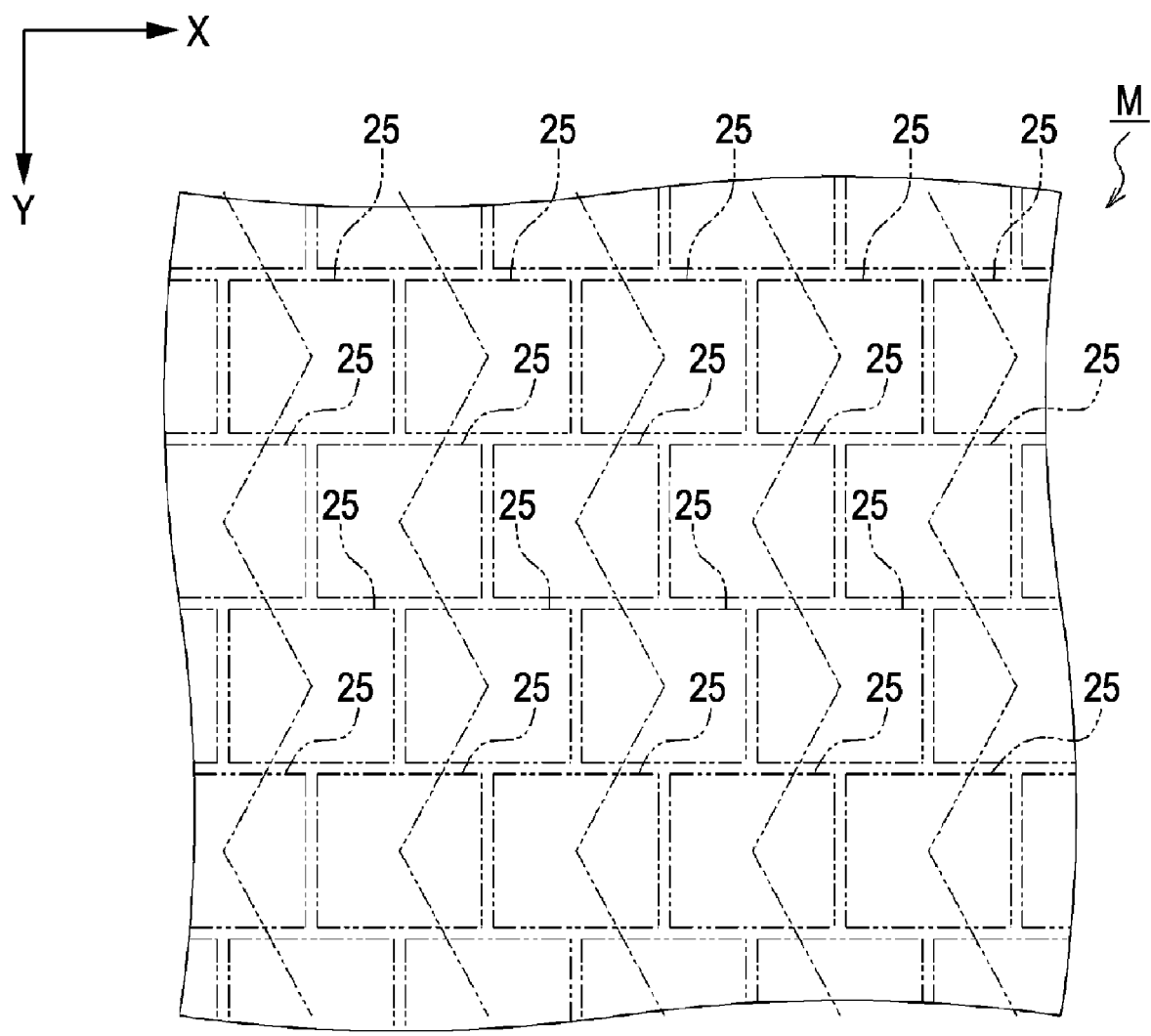
FIG. 22 is a plan view of the arrangement of a plurality of pixel groups.

In both the display 1 and the display 10, as shown in FIG. 5, the plurality of pixel groups 25 are arranged in the X and Y directions, i.e., in a matrix. However, the arrangement of the plurality of pixel groups 25 is not so limited. For example, as shown in FIG. 22, the plurality of pixel groups 25 may be arranged in a staggered pattern in the Y direction. In the case of the arrangement shown in FIG. 22, the first and second pixels $5_1$ and $5_2$, shown in FIG. 4, are alternately arranged in the X direction and in the Y direction.

Figure 23:
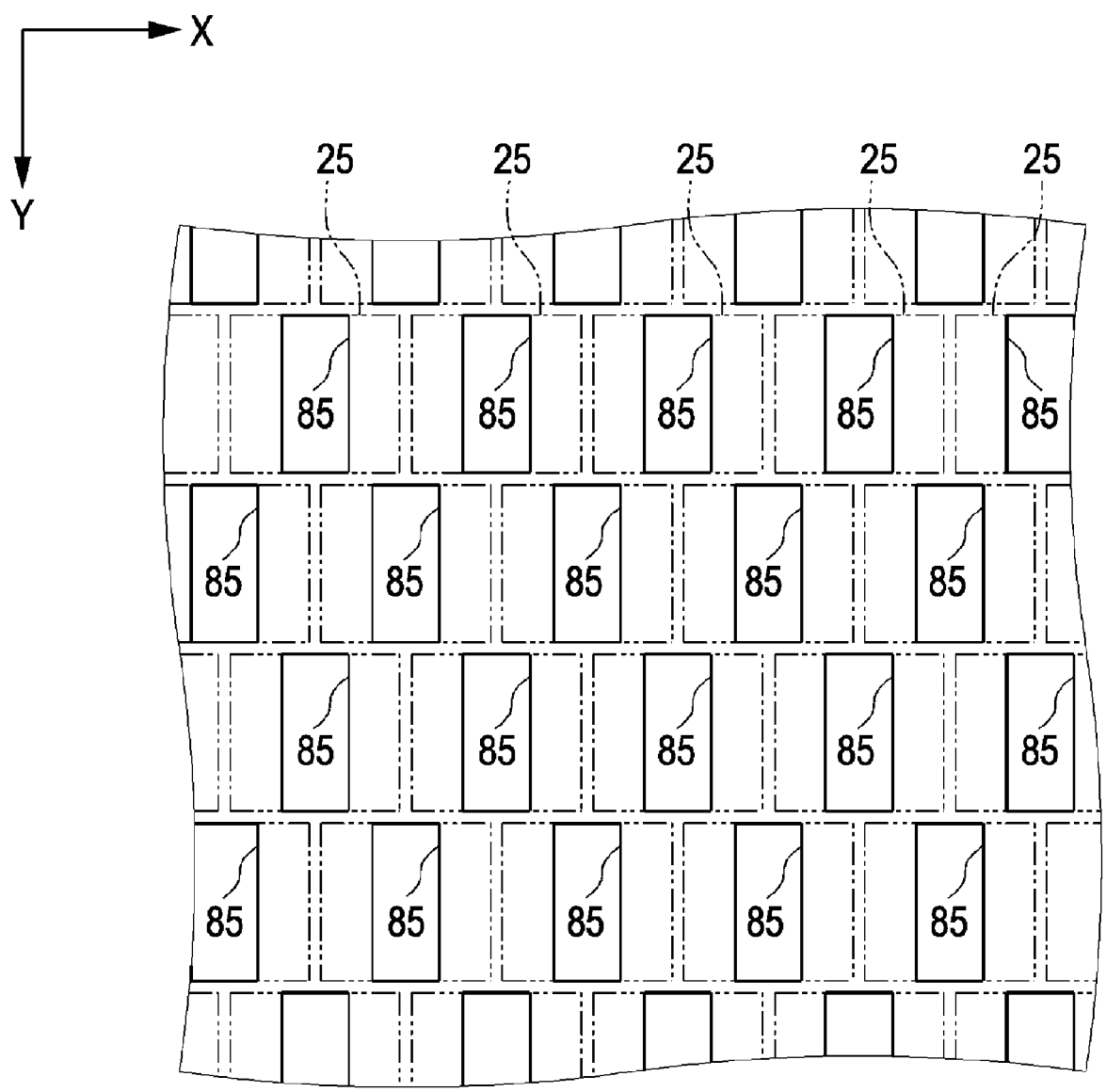
FIG. 23 is a plan view of a light-shielding film.

In both the display 1 and the display 10, as shown in FIG. 23, the opening 85 in the light-shielding film 83 is arranged in each pixel group 25. To correspond to the staggered arrangement of the plurality of pixel groups 25 in the Y direction, the plurality of openings 85 are also arranged in a staggered pattern. Thus, the distance between diagonally adjacent openings 85 can be reduced compared with the arrangement in which the plurality of pixel groups 25 are arranged in a matrix in the X and Y directions. This can easily increase the resolution in each of the first image and the second image in the diagonal direction, thereby more easily resulting in higher definition in the directional display mode.

Figure 24:
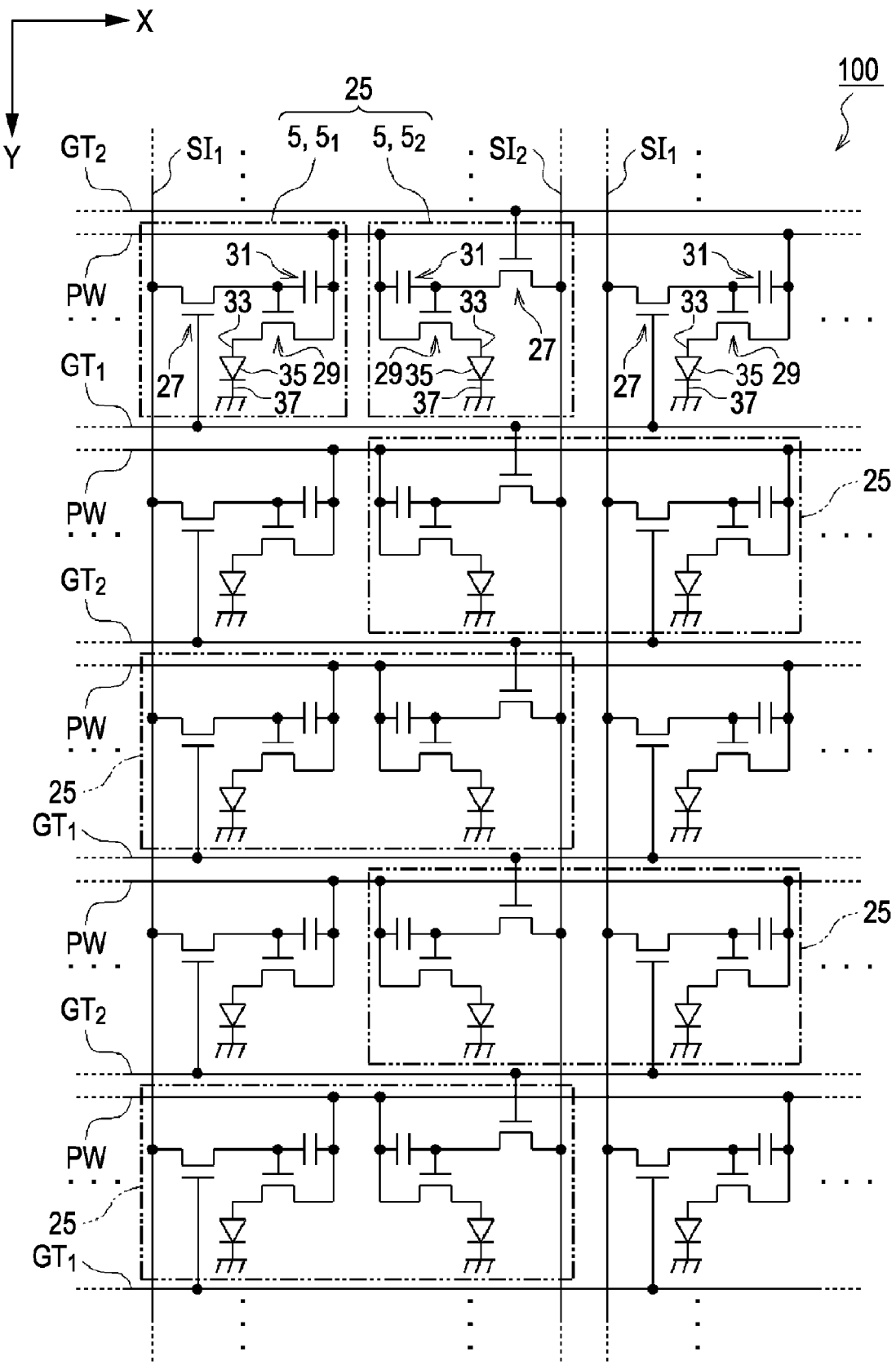
FIG. 24 is a schematic circuit diagram of a display according to another embodiment of the invention.

In a display 100 in which the staggered arrangement of the plurality of pixel groups 25 in the Y direction is used as the display 1, as shown in FIG. 24, the scan lines $GT_1$ and $GT_2$ can be shared between diagonally adjacent pixel groups 25 in the Y direction.

In the display 1 described above, the scan lines $GT_1$ and $GT_2$ are arranged for each pixel row 23. In contrast, in the display 100, one scan line $GT_1$ or one scan line $GT_2$ can be shared between adjacent pixel groups 25 in the Y direction. Thus, in the display 100, the number of the scan lines $GT_1$ and $GT_2$ can be less than with the display 1.

In the display 100, one pixel column 21 (see FIG. 3) includes the first and second pixels $5_1$ and $5_2$. Thus, data lines SI corresponding to the pixel columns 21 do not correspond to each of the first and second pixels $5_1$ and $5_2$. That is, the data lines SI are shared between the first and second pixels $5_1$ and $5_2$.

The display 100 may have a structure without the color filter 87. Even when the display 100 has the structure without the color filter 87, color display can be performed in the same way as described with the displays 1 and 10.

In the case of the display 100 not including the color filter 87, it is preferable that one pixel column 21r, one pixel column 21g, and one pixel column 21b, which are shown in FIG. 3, are arranged in a repeating configuration so as to reduce the conversion of data sequences supplied to the data lines $SI_1$ and $SI_2$.

Figure 25:
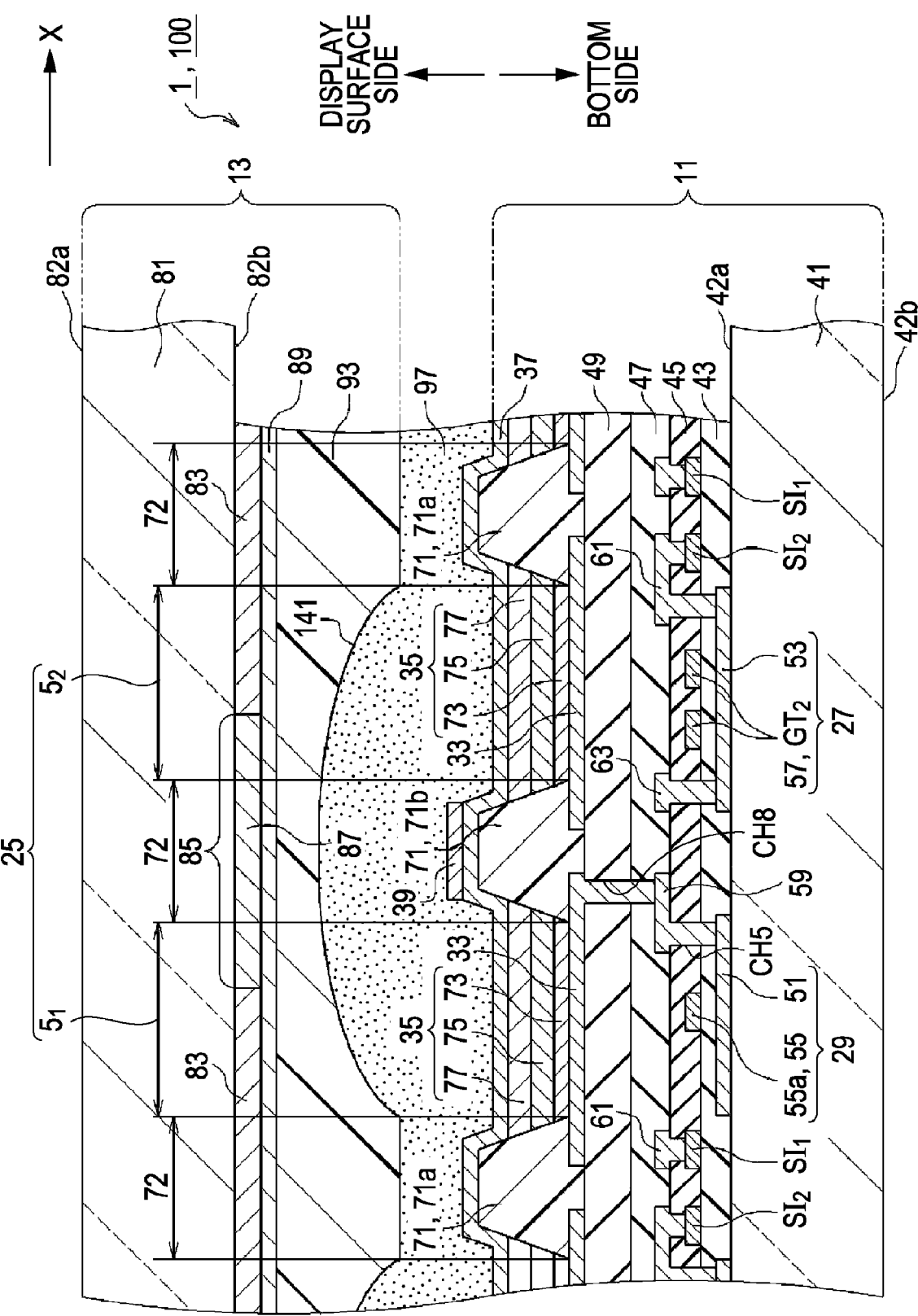
FIG. 25 is a cross-sectional view of a display according to another embodiment of the invention.

In each of the displays 1, 10, and 100 and similar structures which exclude the color filters 87, the resin layer 93 has the prismatic portions 95a and 95b, but the structure of the resin layer 93 is not limited thereto. As shown in FIG. 25, the resin layer 93 may have lens portions 141. In this case, the adhesive 97 having a refractive index larger than that of the resin layer 93 can be used.

Figure 26:
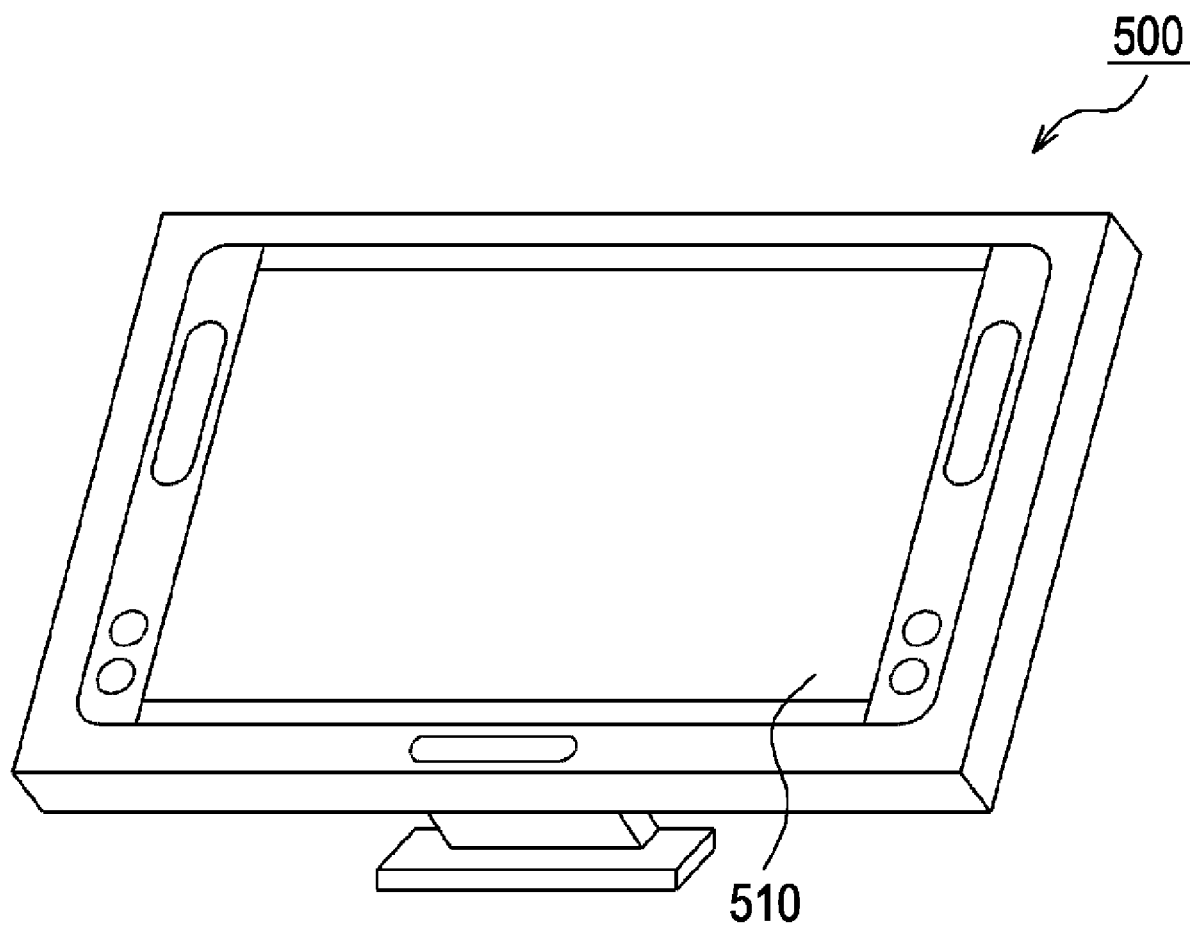
FIG. 26 is a perspective view of an electronic apparatus including a display.
Figure 27A:
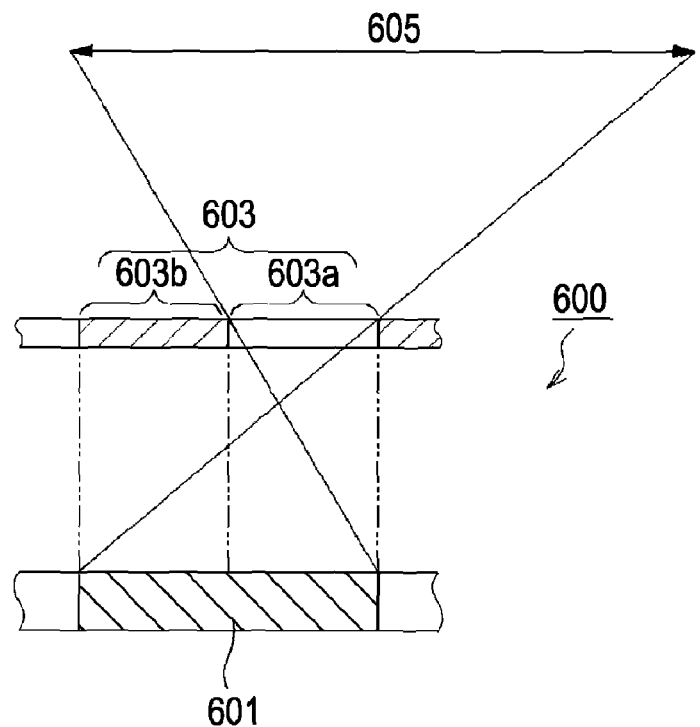
FIGS. 27A and 27B are cross-sectional views illustrating the related art.
Figure 27B:
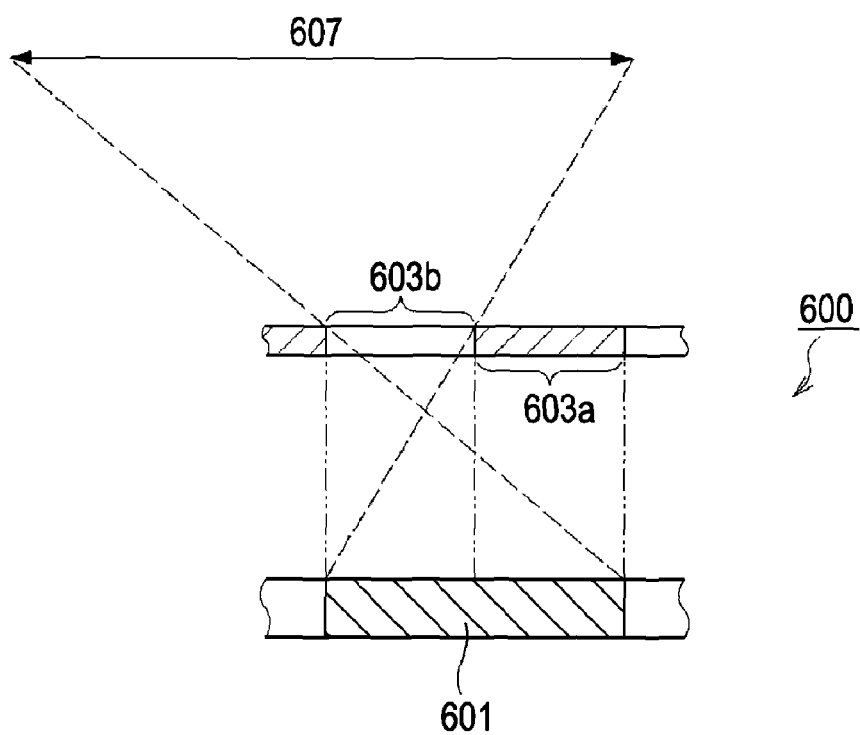
Figure 28A:
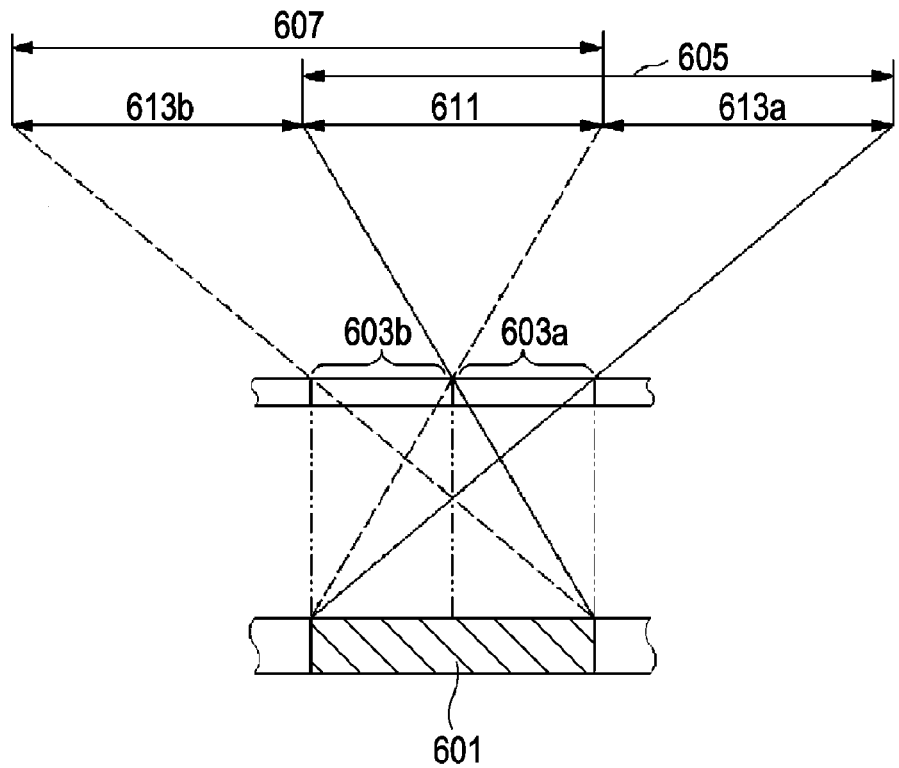
FIGS. 28A and 28B are cross-sectional views illustrating the related art.
Figure 28B:
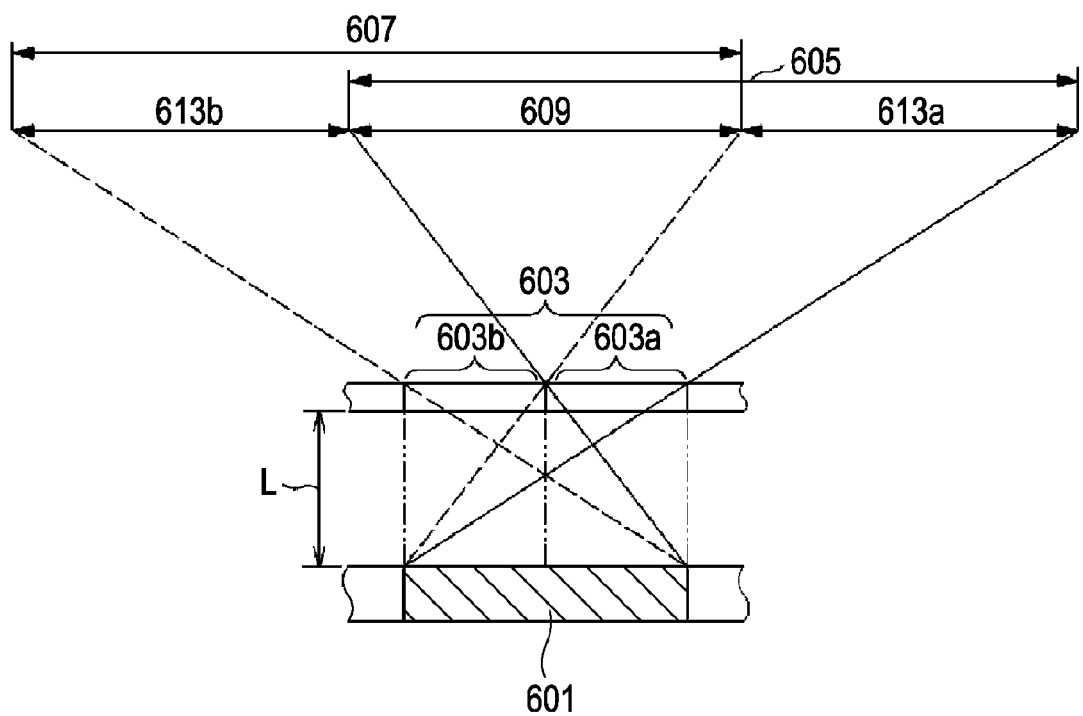

Each of the displays 1, 10, and 100 and structures excluding the color filters 87 from these displays described above can be applied to, for example, a display portion 510 of an electronic apparatus 500 as shown in FIG. 26. The electronic apparatus 500 is a display device used for a car navigation system. In the electronic apparatus 500, the use of the display portion 510 to which the display 1, 10, or 100 or a similar structure excluding the color filters 87 is used can result in the visual recognition of, for example, a map image as the first image from the driver side and the visual recognition of a second image, such as a movie, from the passenger side.

Furthermore, since the display 1, 10, or 100 or similar structure excluding the color filters 87, is applied to the display portion 510, the suitable viewing range 119a and the suitable viewing range 119b can be easily extended in the directional display mode.

Moreover, in the electronic apparatus 500, the pixel density in the X direction can be easily increased in the display 1, 10, or 100 or similar structure excluding the color filters 87, thereby resulting in higher definition in the directional display mode.

The electronic apparatus 500 is not limited to the display used for the car navigation system and examples of apparatuses capable of utilizing aspects of the invention include various electronic apparatuses, such as cellular phones, mobile computers, digital still cameras, digital video cameras, vehicle-mounted apparatuses, and audio apparatuses.

What is claimed is:

1. An electro-optical device comprising:
a first substrate;
a second substrate facing the first substrate;
a light-emitting layer arranged between the first substrate and the second substrate which is capable of emitting light from a plurality of pixels including at least a first subpixel and a second subpixel, the first subpixel forming a first image and the second subpixel forming a second image;
a light-shielding layer arranged between the second substrate and the light-emitting layer having an opening which is capable of transmitting light emitted from a first subpixel in the light-emitting layer through the second substrate to a first range and transmitting light emitted from the second subpixel of the light-emitting layer through the second substrate to a second range;
a first electrode arranged between the first substrate and the light-emitting layer, the first electrode facing the light-emitting layer;
a second electrode arranged between the light-emitting layer and the light-shielding layer, the second electrode facing the light-emitting layer;
a plurality of transistors corresponding to each of the pixels, each of the transistors being capable of controlling the flow of current between first electrode and the second electrode through the light-emitting layer;
a power line arranged between the first substrate and the first electrode extending in a first direction which is capable of supplying electric power to the plurality of transistors,
a plurality of control lines;
a plurality of signal lines;
a plurality of capacitor elements corresponding to each of the pixels arranged in the area between the first substrate and the power line above the power line, the capacitor elements being capable of holding a gate potential of each of the transistors; and
a plurality of switching elements corresponding to each of the pixels arranged between the first substrate and the light-emitting layer, the switching elements being capable of supplying and blocking of the flow of a current between the first and second electrode through the light-emitting layer, and each of the switching elements being controlled by a control signal supplied to one control line selected from the plurality of control lines.

2. The electro-optical device according to claim 1, further comprising:

a resin layer arranged between the light-emitting layer and the light-shielding layer.

3. An electro-optical device comprising:
a first substrate;
a second substrate facing the first substrate;
a light-emitting layer arranged between the first substrate and the second substrate, light-emitting layer being capable of emitting light from a plurality of pixels;
a light-shielding layer arranged between the second substrate and the light-emitting layer;
a first electrode arranged between the first substrate and the light-emitting layer, the first electrode facing the light-emitting layer;
a second electrode arranged between the light-emitting layer and the light-shielding layer, the second electrode facing the light-emitting layer;
a plurality of transistors corresponding to each of the pixels, each of the transistors being capable of controlling the flow of current between first electrode and the second electrode through the light-emitting layer;
a power line arranged between the first substrate and the first electrode extending in a first direction which is capable of supplying electric power to the plurality of transistors,
a plurality of control lines;
a plurality of signal lines;
a plurality of capacitor elements corresponding to each of the pixels arranged in the area between the first substrate and the power line above the power line, the capacitor elements being capable of holding a gate potential of each of the transistors; and
a switching element arranged between one signal line selected from the plurality of signal lines and the corresponding capacitor element, each of the switching elements being controlled by a control signal supplied to one control line selected from the plurality of control lines
wherein the plurality of pixels includes at least a first subpixel and a second subpixel arranged in an alternating configuration in the first direction, the first subpixel forming a first image which is emitted from the first subpixel of the light-emitting layer to a first range, and the second subpixel forming a second image which is emitted from the second subpixel of the light-emitting layer to a second range.

4. The electro-optical device according to claim 3, further comprising:
a resin layer arranged between the light-emitting layer and the light-shielding layer.

5. The electro-optical device according to claim 3, wherein each of the transistors is disposed on one side of the power line and a corresponding switching element is disposed on the other side of the power line in a second direction intersecting the first direction, and each of the transistors faces the corresponding switching element.

6. The electro-optical device according to claim 5, wherein the transistors and the switching elements are arranged between the first substrate and the power line, each of the transistors includes a first semiconductor layer having a channel region, a source region, and a drain region, and each of the switching elements includes a second semiconductor layer having a channel region, a source region, and a drain region, where the channel region, the source region, and the drain region in each of the first and second semiconductor layers are aligned in the first direction.

7. The electro-optical device according to claim 6, wherein each of the transistors has an island electrode formed above the channel region of the corresponding first semiconductor layer, and the capacitor elements comprise at least one first semiconductor layer and island electrode.

8. The electro-optical device according to claim 7, wherein each island electrode extends across the power line in the second direction, each first semiconductor layer extends across the power line in the second direction in plan, and each island electrode is electrically connected to the drain region of a corresponding second semiconductor layer disposed on the side of the power line.

9. The electro-optical device according to claim 6, wherein the drain region of each first semiconductor layer is disposed to the side of the power line, and the drain region of each first semiconductor layer is electrically connected to the first electrode on the side of the power line.

10. The electro-optical device according to claim 9, wherein the drain region of one of the first semiconductor layers is disposed on one side of the power line in a first pixel, while the drain region is disposed on the other side of the power line in an adjacent first pixel in the first direction.

11. The electro-optical device according to claim 10, wherein at least the first subpixel and the second subpixel are adjacent in the first direction, each of the control lines extends in the first direction and corresponds to either the first subpixel and the second subpixel, and
each of the signal lines extends in the second direction and corresponds to either the first subpixel or the second subpixel.

12. The electro-optical device according to claim 11, wherein the transistor in the first pixel is adjacent to the switching element in an adjacent second subpixel in the first direction, wherein the first subpixel is also adjacent to the second subpixel in the second direction, and the transistor in the first subpixel is adjacent to the switching element of the second subpixel in the second direction with at least one control line provided between the transistor in the first subpixel and the switching element in the second subpixel.

13. The electro-optical device according to claim 11, wherein the transistor and the switching element in a first subpixel and the transistor and the switching element in an adjacent second subpixel in the first direction are located between the signal line corresponding to the first pixel and the signal line corresponding to the second subpixel.

14. The electro-optical device according to claim 13, wherein the plurality of pixels are divided into a plurality of pixel groups comprising at least a first subpixel and an adjacent second subpixel in the first direction, wherein the plurality of pixel groups are aligned in the first direction, the plurality of signal lines are arranged between the first substrate and the power line and extend across the power line in the second direction, and the power line extends across adjacent pixel groups in the first direction.

15. The electro-optical device according to claim 14, wherein a connecting portion electrically connecting each of the first semiconductor layers to the power line is arranged in a region located between each of the signal lines and a corresponding island electrode.

16. The electro-optical device according to claim 11, further comprising:
a second connecting portion electrically connecting the drain region of each of the first semiconductor layers to the first electrode; and
a second light-shielding layer capable of partitioning at least a first subpixel and an adjacent second subpixel in the first direction,
wherein the second light-shielding layer is arranged between the first electrode and the light-shielding layer on top of the second connecting portion corresponding to the first and second subpixel.

17. The electro-optical device according to claim 16, further comprising:
an auxiliary lead arranged between the second electrode and the light-shielding layer, the auxiliary lead being electrically connected to the second electrode, wherein the auxiliary lead is formed on top of the second light-shielding layer.

18. An electronic apparatus comprising:
a display portion comprising the electro-optical device of claim 1.

* * * * *